(12) United States Patent
Kobayashi

(10) Patent No.: US 10,872,565 B2
(45) Date of Patent: Dec. 22, 2020

(54) DISPLAY DEVICE

(71) Applicant: Semiconductor Energy Laboratory Co., Ltd., Atusugi (JP)

(72) Inventor: Hidetomo Kobayashi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 15/869,600

(22) Filed: Jan. 12, 2018

(65) Prior Publication Data
US 2018/0204520 A1    Jul. 19, 2018

(30) Foreign Application Priority Data

Jan. 16, 2017    (JP) ................. 2017-004943

(51) Int. Cl.
  *G09G 3/3258* (2016.01)
  *H01L 51/52* (2006.01)
  *G09G 3/36* (2006.01)
  *H01L 27/32* (2006.01)
  (Continued)

(52) U.S. Cl.
  CPC ......... *G09G 3/3258* (2013.01); *G09G 3/3233* (2013.01); *G09G 3/3266* (2013.01); *G09G 3/3648* (2013.01); *G09G 3/3674* (2013.01); *H01L 27/3276* (2013.01); *H01L 51/5203* (2013.01); *G09G 2310/0213* (2013.01); *G09G 2310/0264* (2013.01);
  (Continued)

(58) Field of Classification Search
  CPC .. G09G 3/3266; G09G 3/3674; G09G 3/3233; G09G 3/3258; G09G 3/3648; G09G 2310/0213; G09G 2310/0264; G09G 2320/0223; G09G 2320/0233; G09G 2330/028; H01L 51/5203; H01L 27/3276
  See application file for complete search history.

(56) References Cited

U.S. PATENT DOCUMENTS 6,326,941 B1    12/2001    Yamazaki et al.
7,079,124 B2     7/2006    Yamazaki et al.
(Continued)

FOREIGN PATENT DOCUMENTS

JP    2015-180924 A    10/2015

OTHER PUBLICATIONS

Oke.R et al., "World's First 55-in. 120Hz-Driven 8K4K IPS-LCDs with Wide Color Gamut", SID Digest '15 : SID International Symposium Digest of Technical Papers, Jun. 1, 2015, vol. 46, No. 1, pp. 1055-1058.

*Primary Examiner* — Christopher E Leiby
(74) *Attorney, Agent, or Firm* — Fish & Richardson P.C.

(57) ABSTRACT

The display evenness of a large or high-resolution display device is improved. The display device includes a source driver, a first gate driver, a second gate driver, a first pixel, and a second pixel. The first pixel is electrically connected to the source driver and the first gate driver. The second pixel is electrically connected to the source driver and the second gate driver. The first pixel is located closer to the source driver than the second pixel is. The first gate driver has a function of supplying a first write signal to the first pixel. The second gate driver has a function of supplying a second write signal to the second pixel. The pulse width of the second write signal is larger than the pulse width of the first write signal.

8 Claims, 14 Drawing Sheets

(51) Int. Cl.
*G09G 3/3233* (2016.01)
*G09G 3/3266* (2016.01)

(52) U.S. Cl.
CPC .............. *G09G 2320/0223* (2013.01); *G09G 2320/0233* (2013.01); *G09G 2330/028* (2013.01)

(56) References Cited

U.S. PATENT DOCUMENTS

| | | | | |
|---|---|---|---|---|
| 7,193,599 | B2 * | 3/2007 | Kim | G09G 3/3648 345/100 |
| 8,854,286 | B2 | 10/2014 | Yamazaki et al. | |
| 9,368,082 | B2 | 6/2016 | Yamazaki et al. | |
| 9,614,022 | B2 | 4/2017 | Miyake et al. | |
| 10,210,789 | B2 * | 2/2019 | Li | G09G 3/2092 |
| 2006/0284815 | A1 * | 12/2006 | Kwon | G09G 3/3614 345/98 |
| 2011/0090204 | A1 | 4/2011 | Yamazaki et al. | |
| 2014/0176407 | A1 * | 6/2014 | Choi | G09G 3/3677 345/87 |
| 2016/0019853 | A1 * | 1/2016 | Jiang | G09G 3/3681 345/212 |
| 2016/0232868 | A1 | 8/2016 | Yamazaki et al. | |
| 2017/0004788 | A1 | 1/2017 | Yamazaki et al. | |
| 2017/0271431 | A1 | 9/2017 | Miyake et al. | |

\* cited by examiner

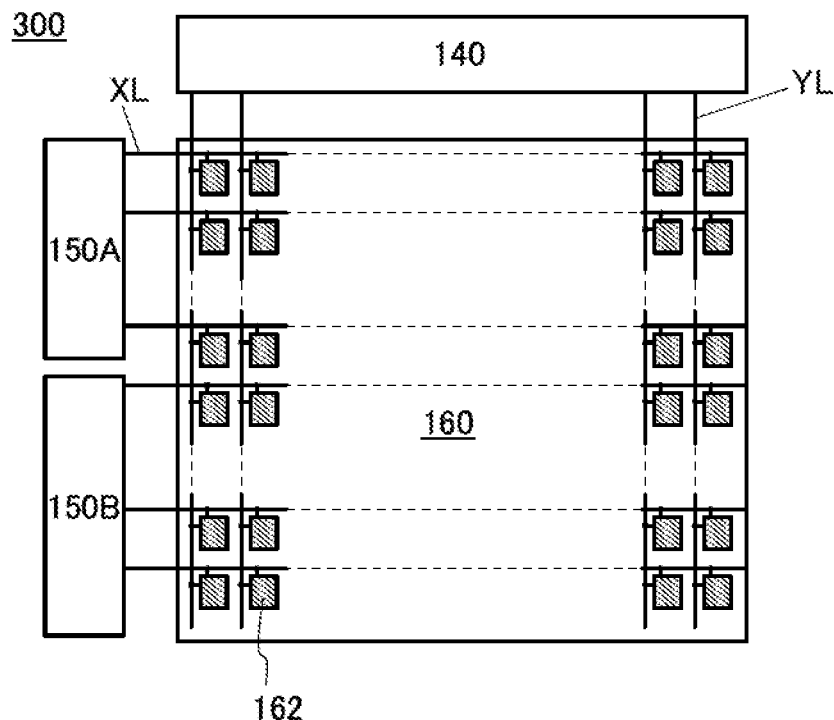
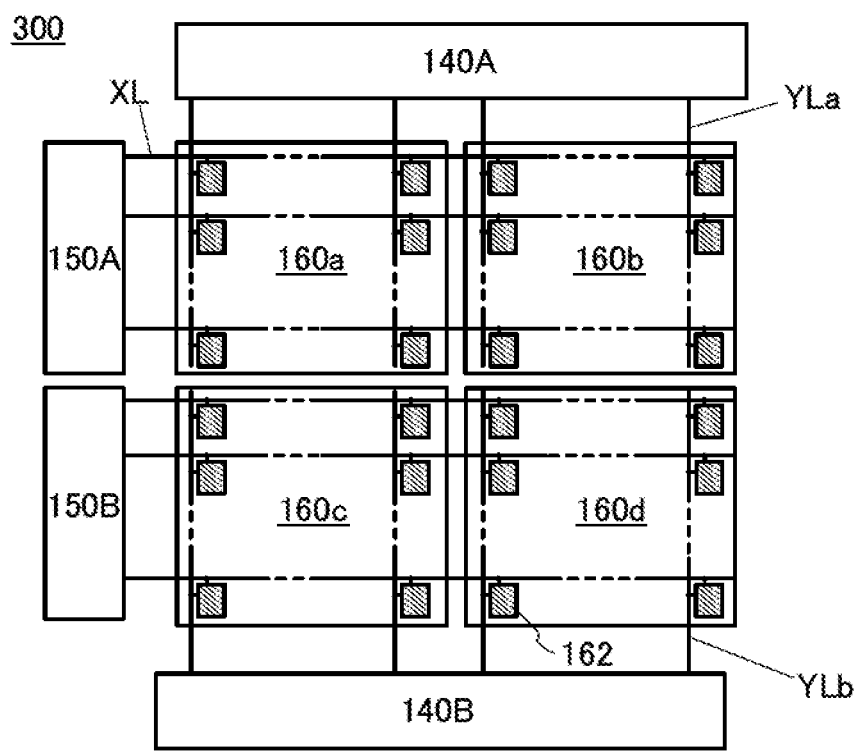

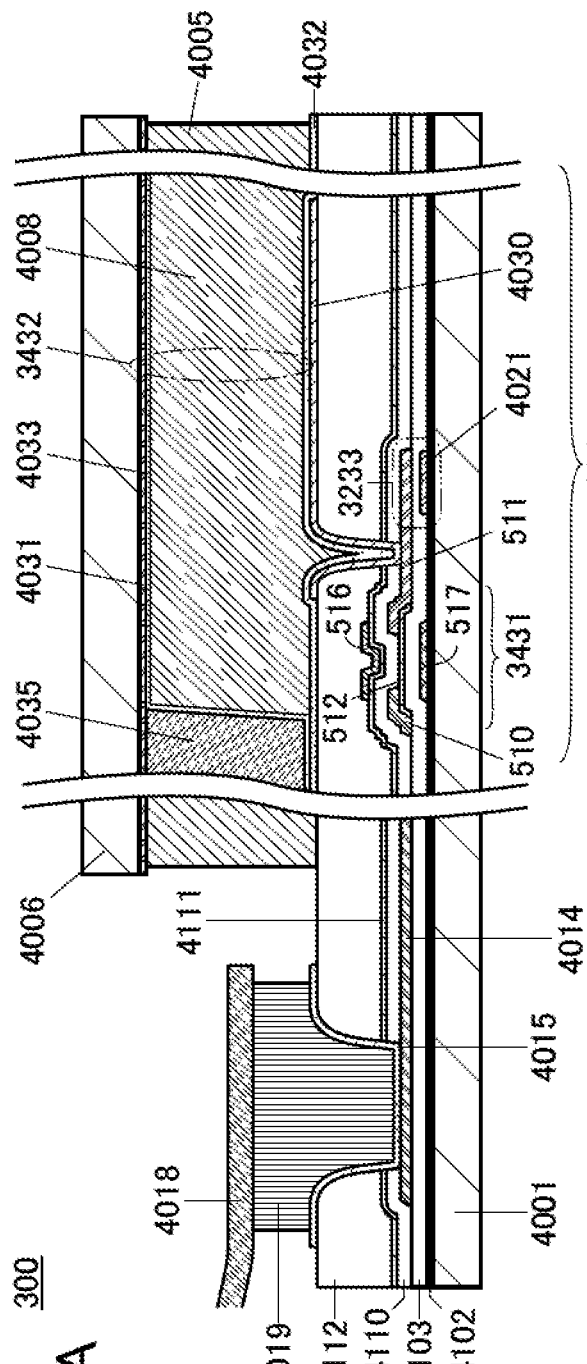
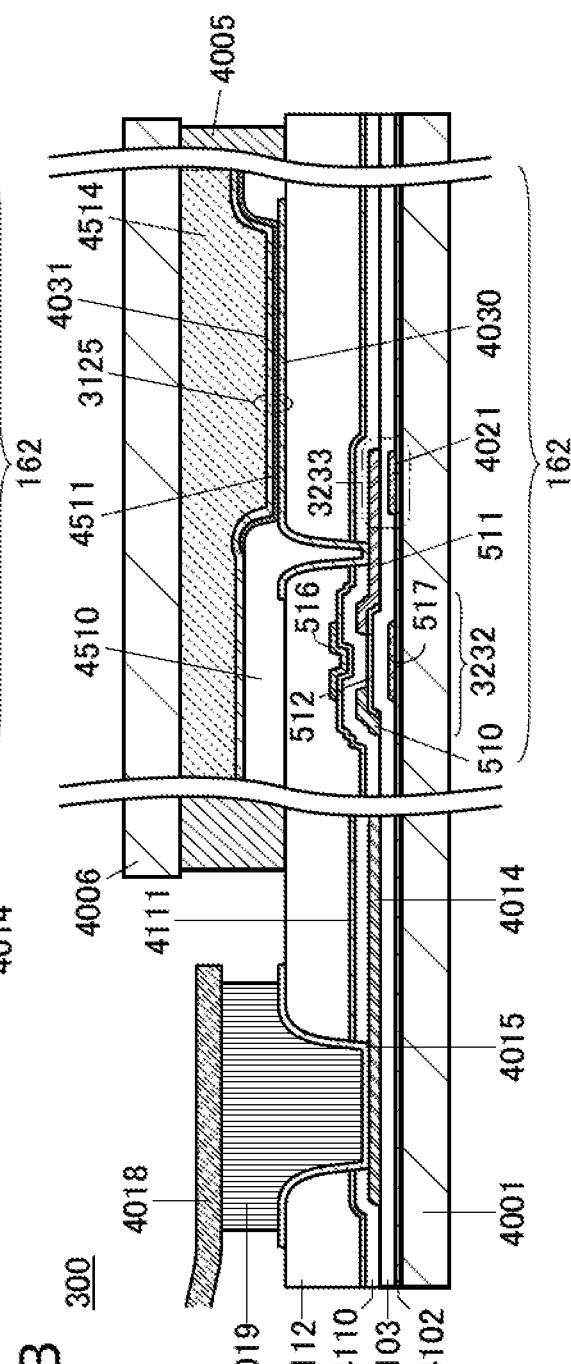
FIG. 10A
FIG. 10B

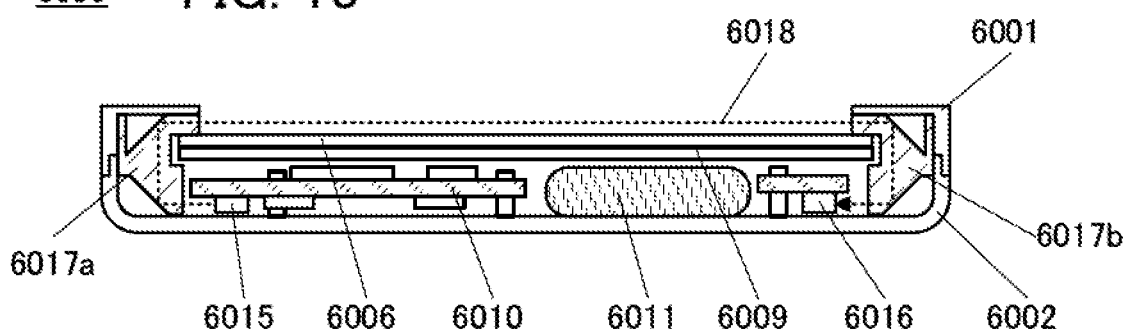

DISPLAY DEVICE

BACKGROUND OF THE INVENTION

1. Field of the Invention

One embodiment of the present invention relates to a display device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, an imaging device, a memory device, a method for driving any of them, and a method for manufacturing any of them.

2. Description of the Related Art

In recent years, larger display devices have been required. Examples include a television device for home use (also referred to as a TV or a television receiver), digital signage, and a public information display (PID). Larger digital signage, PID, and the like can provide an increased amount of information, and attract more attention when used for advertisement or the like, so that the effectiveness of the advertisement is expected to be increased.

In addition, display devices with a higher resolution have been required. For example, television devices (also referred as TVs or television receivers) including a large number of pixels, such as full high definition (1920×1080 pixels), 4K (e.g., 3840×2160 pixels or 4096×2160 pixels), and 8K (e.g., 7680×4320 pixels or 8192×4320 pixels) television devices, have been actively developed.

As an example of a means for achieving a display device with a larger size and a higher resolution, Patent Document 1 discloses a technique for arranging a plurality of display panels such that the display panels do not have an obvious boundary.

REFERENCE

Patent Document

[Patent Document 1] Japanese Published Patent Application No. 2015-180924

SUMMARY OF THE INVENTION

Large or high-resolution display devices tend to have a problem such as display unevenness because their drivers do not have sufficient driving capability relative to the size of the display devices.

For example, in some cases, the increase or decrease rate of a data voltage supplied to a pixel that is located away from a source driver is lower than that of a data voltage supplied to a pixel that is located close to the source driver.

Therefore, when a method for writing data to all pixels is adjusted to the increase or decrease rate of the data voltage supplied to the pixel that is located close to the source driver, there may be insufficient time to write data to the pixel that is located away from the source driver. In other words, it may be difficult to sufficiently supply a data voltage to the pixel that is located away from the source driver. This may cause display unevenness.

When a method for writing data to all pixels is adjusted to the increase or decrease rate of the data voltage supplied to the pixel that is located away from the source driver, degradation of display frequency characteristics may result in a decrease of display quality of the display device.

In view of the above, an object of one embodiment of the present invention is to improve the display evenness of a large or high-resolution display device. Another object of one embodiment of the present invention is to improve the display quality of a large or high-resolution display device.

The objects of one embodiment of the present invention are not limited to the above objects. The objects described above do not disturb the existence of other objects. The other objects are ones that are not described above and will be described below. The other objects will be apparent from and can be derived from the description of the specification, the drawings, and the like by those skilled in the art. One embodiment of the present invention solves at least one of the above objects and the other objects.

One embodiment of the present invention is a display device which includes a source driver, a first gate driver, a second gate driver, a first pixel, and a second pixel. The first pixel is electrically connected to the source driver and the first gate driver. The second pixel is electrically connected to the source driver and the second gate driver. The first pixel is located closer to the source driver than the second pixel is. The first gate driver has a function of supplying a first write signal to the first pixel. The second gate driver has a function of supplying a second write signal to the second pixel. The pulse width of the second write signal is larger than the pulse width of the first write signal.

It is preferable that the display device of the above embodiment further include a third pixel and a fourth pixel; the third pixel be electrically connected to the source driver and the first gate driver; the fourth pixel be electrically connected to the source driver and the second gate driver; the third pixel be located closer to the source driver than the second pixel is; the fourth pixel be located away from the source driver than the first pixel and the third pixel are; the first gate driver have a function of supplying a third write signal to the third pixel after the second gate driver supplies the second write signal; the second gate driver have a function of supplying a fourth write signal to the fourth pixel after the first gate driver supplies the third write signal; and the pulse width of the fourth write signal be larger than the pulse width of the first write signal and the pulse width of the third write signal.

Another embodiment of the present invention is a display device which includes a source driver, a first gate driver, a second gate driver, a first pixel group, and a second pixel group. The first pixel group is electrically connected to the source driver and the first gate driver. The second pixel group is electrically connected to the source driver and the second gate driver. The first pixel group is located closer to the source driver than the second pixel group is. The first gate driver has a function of supplying a first write signal to each of pixels in the first pixel group. The second gate driver has a function of supplying a second write signal to each of pixels in the second pixel group. The pulse width of the second write signal is larger than the pulse width of the first write signal. The supply of the first write signal by the first gate driver and the supply of the second write signal by the second gate driver are performed alternately.

It is preferable that the display device of any of the above embodiments further include a display controller; the display controller have a function of supplying a control signal for the source driver, a control signal for the first gate driver, and a control signal for the second gate driver; the source driver have a function of receiving the control signal for the source driver; the first gate driver have a function of receiving the control signal for the first gate driver; the second gate driver have a function of receiving the control signal for the second gate driver; and one of the control signal for the first gate driver and the control signal for the second gate driver be a rectangular wave with a duty cycle of not 50%.

According to one embodiment of the present invention, the display evenness of a large or high-resolution display device can be improved. According to another embodiment of the present invention, the display quality of a large or high-resolution display device can be improved.

The effects of one embodiment of the present invention are not limited to the above effects. The effects described above do not disturb the existence of other effects. The other effects are ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF THE DRAWINGS

In the accompanying drawings:

FIGS. 7A and 7B are block diagrams illustrating configuration examples of a display panel;

FIGS. 10A and 10B are cross-sectional views illustrating structure examples of a display panel;

FIG. 13 is a cross-sectional view illustrating a structure example of a display module.

DETAILED DESCRIPTION OF THE INVENTION

Figure 1A:
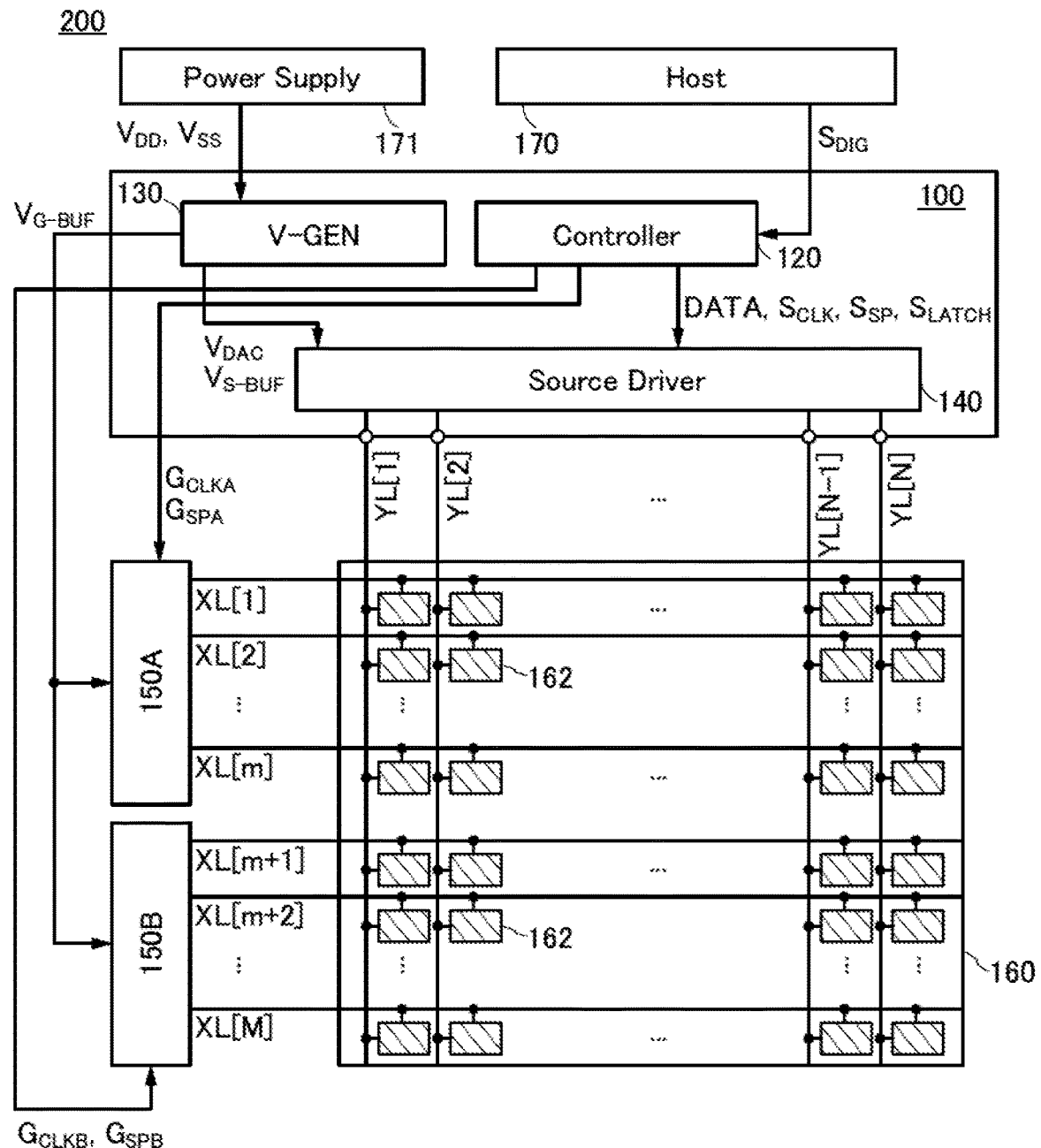
FIGS. 1A and 1B are block diagrams illustrating one embodiment of the present invention.

Embodiments will be hereinafter described with reference to drawings. Note that embodiments can be carried out in many different modes, and it is easily understood by those skilled in the art that modes and details of the present invention can be modified in various ways without departing from the spirit and the scope of the present invention. Therefore, the present invention should not be interpreted as being limited to the description in the following embodiments.

Note that in the structures of the invention described below, the same portions or portions having similar functions are denoted by the same reference numerals in different drawings, and description of such portions is not repeated. Furthermore, the same hatch pattern is applied to similar functions, and these are not especially denoted by reference numerals in some cases.

In addition, the position, size, range, or the like of components illustrated in drawings is not accurately represented in some cases for easy understanding. Therefore, the disclosed invention is not necessarily limited to the position, size, range, or the like disclosed in the drawings.

In this specification and the like, a semiconductor device refers to a device that utilizes semiconductor characteristics, and means a circuit including a semiconductor element (e.g., a transistor, a diode, or a photodiode), a device including the circuit, and the like. The semiconductor device also means any device that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might each include a semiconductor device.

In this specification and the like, a description "X and Y are connected" means that X and Y are electrically connected, X and Y are functionally connected, and X and Y are directly connected. Accordingly, without being limited to a predetermined connection relationship, for example, a connection relationship shown in drawings or text, another connection relationship is included in the drawings or the text. Here, X and Y each denote an object (e.g., a device, an element, a circuit, a wiring, an electrode, a terminal, a conductive film, or a layer).

A transistor has three terminals: a gate, a source, and a drain. A gate is a control node that controls the conduction state of a transistor. Depending on the channel type of the transistor or levels of potentials applied to the terminals, one of two input/output nodes functions as a source and the other functions as a drain. Therefore, the terms "source" and "drain" can be interchanged in this specification and the like. In this specification and the like, the two terminals other than the gate may be referred to as a first terminal and a second terminal or as a third terminal and a fourth terminal.

A node can be referred to as a terminal, a wiring, an electrode, a conductive layer, a conductor, an impurity region, or the like depending on a circuit configuration, a device structure, and the like. Furthermore, a terminal, a wiring, or the like can be referred to as a node.

A voltage usually refers to a potential difference between a given potential and a reference potential (e.g., a ground potential or a source potential). Thus, a voltage can be referred to as a potential. Note that a potential has a relative value; therefore, GND does not necessarily mean 0 V.

In this specification and the like, ordinal numbers such as "first," "second," and "third" are used to show the order in some cases. Alternatively, ordinal numbers are used to avoid confusion among components in some cases, and do not limit the number or order of the components. For example, it is possible to replace the term "first" with the term "second" or "third" in describing one embodiment of the present invention.

Note that the terms "film" and "layer" can be interchanged with each other depending on the case or circumstances. For example, the term "conductive layer" can be changed into the term "conductive film." Also, the term "insulating film" can be changed into the term "insulating layer."

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor in some cases. In other words, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

Embodiment 1

In this embodiment, a display device of one embodiment of the present invention will be described with reference to FIGS. 1A and 1B, FIGS. 2A and 2B, FIG. 3, FIGS. 4A and 4B, FIGS. 5A and 5B, and FIGS. 6A and 6B.

Figure 1B:
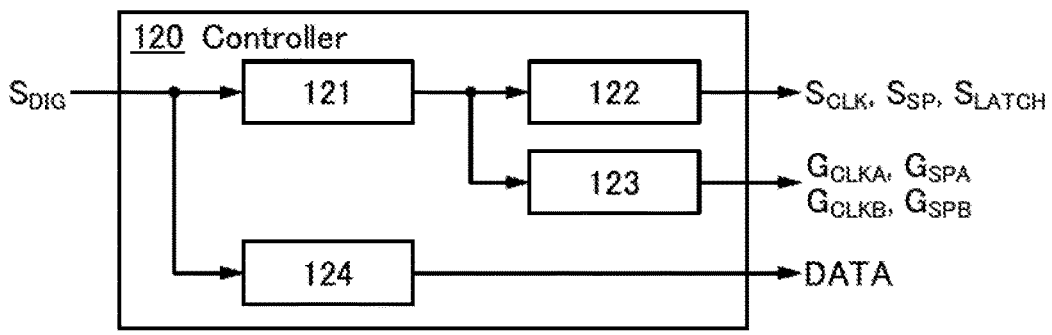

FIG. 1A is a block diagram illustrating a display device 200 which is one example of the display device of one embodiment of the present invention. FIG. 1B is a block diagram illustrating a display controller included in the display device 200.

Figure 2A:
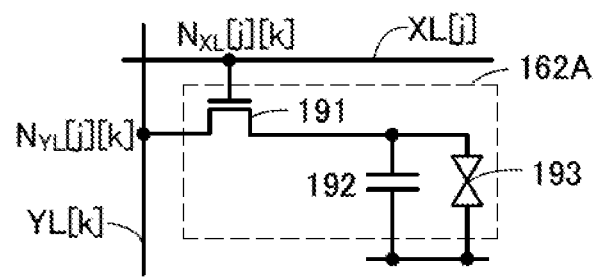
FIGS. 2A and 2B are circuit diagrams illustrating one embodiment of the present invention.
Figure 2B:
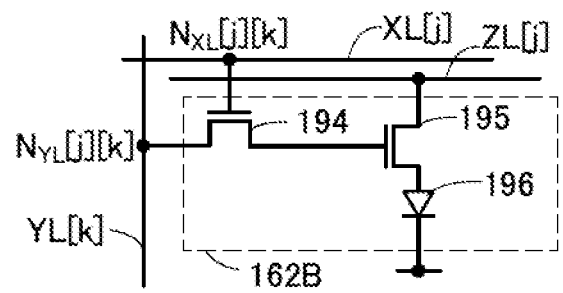

FIGS. 2A and 2B are circuit diagrams each illustrating a pixel included in the display device 200.

Figure 3:
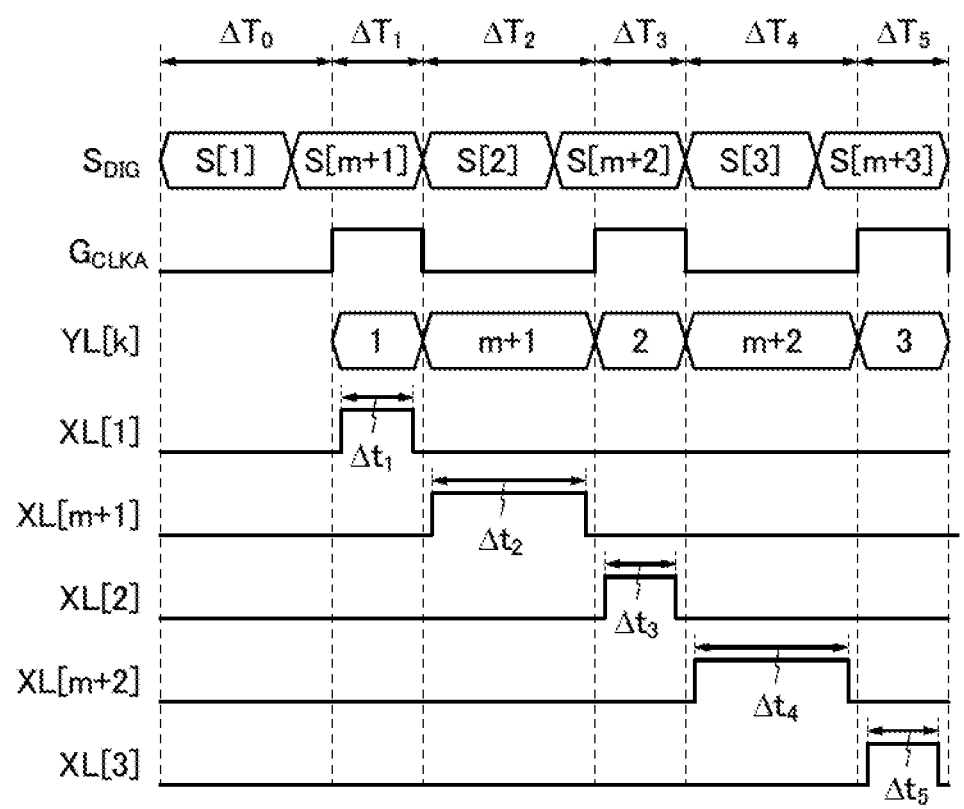
FIG. 3 is a timing chart illustrating one embodiment of the present invention.

FIG. 3 is a timing chart illustrating a method for driving the display device 200.

Figure 4A:
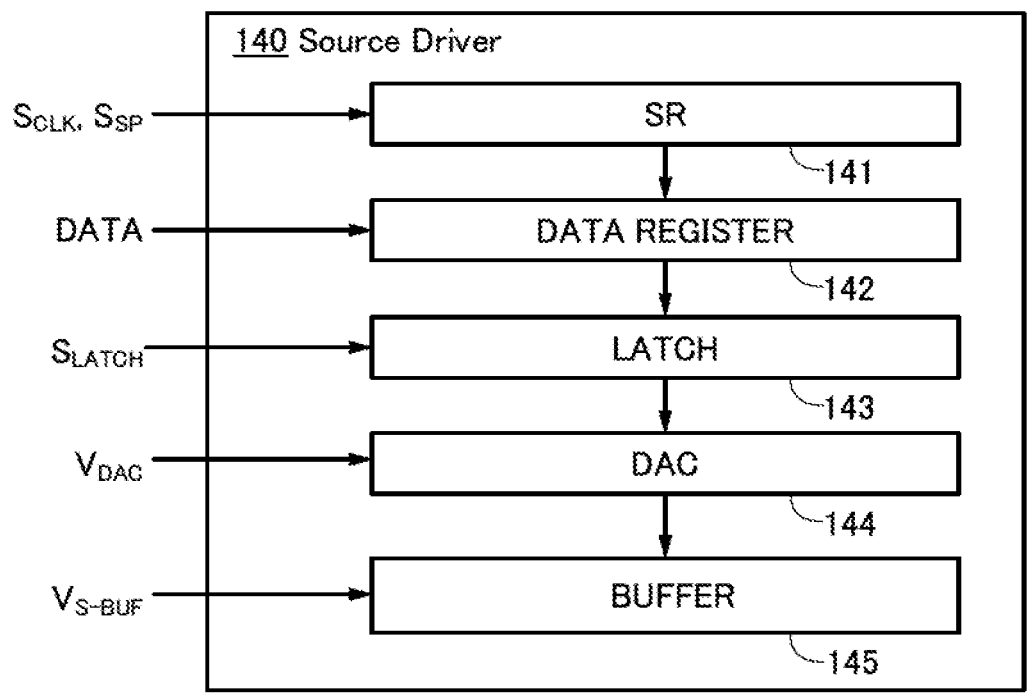
FIGS. 4A and 4B are a block diagram and a circuit diagram illustrating one embodiment of the present invention.
Figure 4B:
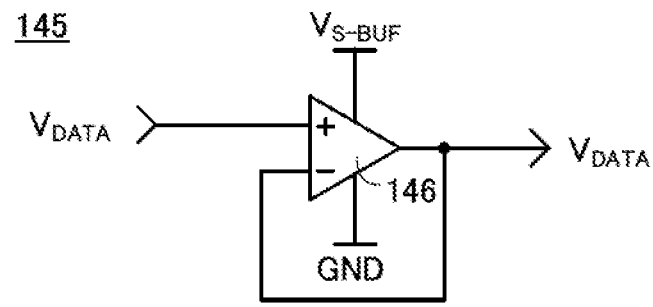

FIGS. 4A and 4B are a block diagram and a circuit diagram illustrating a source driver included in the display device 200.

Figure 5A:
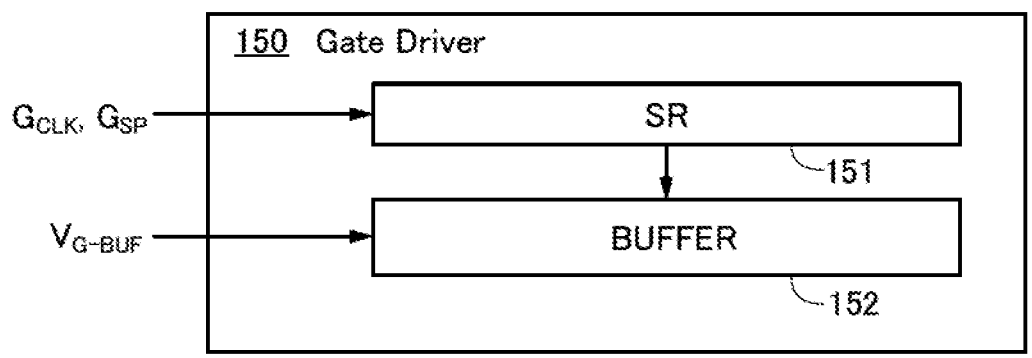
FIGS. 5A and 5B are a block diagram and a circuit diagram illustrating one embodiment of the present invention.
Figure 5B:
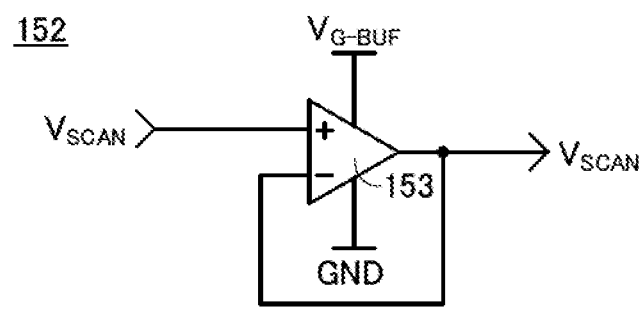

FIGS. 5A and 5B are a block diagram and a circuit diagram illustrating a gate driver included in the display device 200.

Figure 6A:
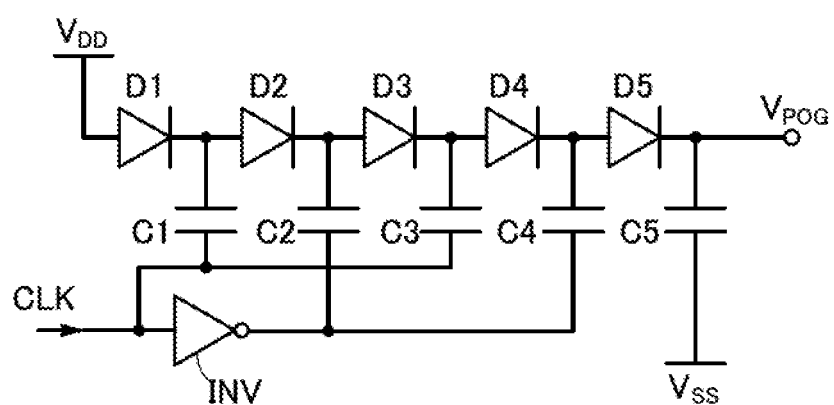
FIGS. 6A and 6B are circuit diagrams illustrating one embodiment of the present invention.
Figure 6B:
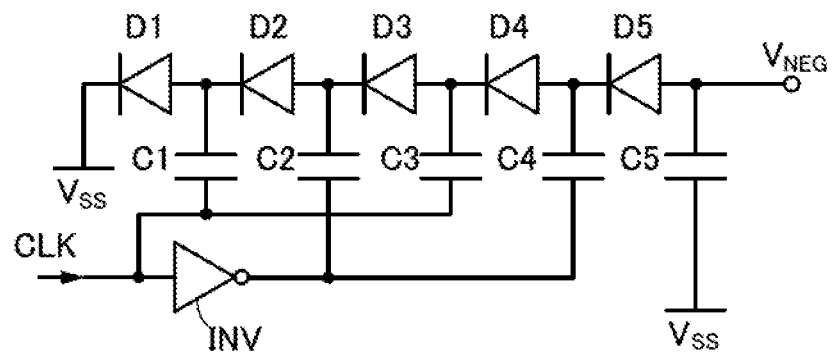

FIGS. 6A and 6B are circuit diagrams each illustrating a voltage generator circuit included in the display device 200.

First, a configuration of the display device of one embodiment of the present invention is described with reference to FIG. 1A and FIG. 3.

As illustrated in FIG. 1A, the display device 200 includes a display driver IC 100, a gate driver 150A, a gate driver 150B, scan lines XL[1] to XL[M] (M is a natural number greater than or equal to 2), signal lines YL[1] to YL[N] (N is a natural number greater than or equal to 2), and a pixel portion 160.

The display driver IC 100 includes a source driver 140, a display controller 120, and a voltage generator circuit 130.

A digital signal $S_{DIG}$ output from a host processor 170 is input to the display controller 120 (shown as "Controller" in the diagrams) through an interface. On the basis of the digital signal $S_{DIG}$, the display controller 120 supplies control signals for the source driver 140, control signals for the gate driver 150A, control signals for the gate driver 150B, and display data DATA. The control signals for the source driver 140 are a clock signal $S_{CLK}$, a start pulse $S_{SP}$, and a latch signal $S_{LATCH}$, for example. The control signals for the gate driver 150A are a clock signal $G_{CLKA}$ and a start pulse $G_{SPA}$, for example. The control signals for the gate driver 150B are a clock signal $G_{CLKB}$ and a start pulse $G_{SPB}$, for example.

FIG. 1B illustrates an example of a configuration of the display controller 120 included in the display driver IC 100. In FIG. 1B, the display controller 120 includes a reference clock generator circuit 121, a horizontal clock generator circuit 122, a vertical clock generator circuit 123, and a video signal processing circuit 124.

In the display controller 120 illustrated in FIG. 1B, the reference clock generator circuit 121 generates a reference clock from the digital signal $S_{DIG}$. This reference clock is input to the horizontal clock generator circuit 122 and the vertical clock generator circuit 123. From the reference clock, the horizontal clock generator circuit 122 generates the control signals for the source driver 140, such as the clock signal $S_{CLK}$, the start pulse $S_{SP}$, and the latch signal $S_{LATCH}$. In addition, from the reference clock, the vertical clock generator circuit 123 generates the control signals for the gate driver 150A, such as the clock signal $G_{CLKA}$ and the start pulse $G_{SPA}$, and the control signals for the gate driver 150B, such as the clock signal $G_{CLKB}$ and the start pulse $G_{SPB}$.

The clock signals $G_{CLKA}$ and $G_{CLKB}$ generated from the reference clock are each a rectangular wave with a duty cycle of not 50%. The details of the clock signals $G_{CLKA}$ and $G_{CLKB}$ and the like will be described later.

In the display controller 120 illustrated in FIG. 1B, the video signal processing circuit 124 generates the display data DATA from the digital signal $S_{DIG}$.

Note that the digital signal $S_{DIG}$ is output from the host processor 170 in FIG. 1A, but the configuration of the display device of one embodiment of the present invention is not limited thereto. A signal output from the host processor or the like may be input to the display controller 120 as the digital signal $S_{DIG}$ through, for example, a timing controller, a frame memory, or the like.

A voltage $V_{DD}$ and a voltage $V_{SS}$ that serve as reference voltages output from a power supply 171 (shown as "Power Supply" in the diagram) are input to the voltage generator circuit 130 (shown as "V-GEN" in the diagram). Note that the voltage $V_{SS}$ is preferably a ground voltage GND. The voltage generator circuit 130 generates voltages for driving the source driver 140 and the gate drivers 150A and 150B on the basis of the voltage $V_{DD}$ and the voltage $V_{SS}$. Voltages output to the source driver 140 are a voltage $V_{DAC}$ and a voltage $V_{S\text{-}BUF}$, for example. A voltage output to the gate drivers 150A and 150B is a voltage $V_{G\text{-}BUF}$, for example.

The source driver 140 converts the display data DATA into a data voltage ($V_{DATA}$) in accordance with the voltage $V_{DAC}$, the voltage $V_{S\text{-}BUF}$, and the control signals (the clock signal $S_{CLK}$, the start pulse $S_{SP}$, and the latch signal $S_{LATCH}$) and outputs the data voltage ($V_{DATA}$). A detailed configuration of the source driver 140 will be described later.

The gate driver 150A is electrically connected to the scan lines XL[1] to XL[m] (m is a natural number greater than or equal to 2 and less than M). The gate driver 150A outputs a scan voltage ($V_{SCAN}$) to the scan lines XL[1] to XL[m] in accordance with the voltage $V_{G\text{-}BUF}$ and the control signals (the clock signal $G_{CLKA}$ and the start pulse $G_{SPA}$).

The gate driver 150B is electrically connected to the scan lines XL[m+1] to XL[M]. The gate driver 150B outputs the scan voltage ($V_{SCAN}$) to the scan lines XL[m+1] to XL[M] in accordance with the voltage $V_{G\text{-}BUF}$ and the control signals (the clock signal $G_{CLKB}$ and the start pulse $G_{SPB}$). Detailed configurations of the gate drivers 150A and 150B will be described later.

The signal lines YL[1] to YL[N] are sequentially arranged substantially parallel to each other in a region overlapping with the pixel portion 160. The signal lines YL[1] to YL[N] are electrically connected to the source driver 140. In addition, the signal lines YL[1] to YL[N] are electrically connected to the pixel portion 160.

The scan lines XL[1] to XL[M] are sequentially arranged substantially parallel to each other in a region overlapping with the pixel portion 160. The scan lines XL[1] to XL[m] are electrically connected to the gate driver 150A. The scan lines XL[m+1] to XL[M] are electrically connected to the gate driver 150B. The scan lines XL[1] to XL[M] are electrically connected to the pixel portion 160.

Note that in this specification and the like, among the scan lines XL[1] to XL[M], the scan line closest to the source driver 140 is referred to as the scan line XL[1]. Furthermore, in this specification and the like, the scan lines XL[1] to XL[m] are closer to the source driver 140 than the scan lines XL[m+1] to XL[M] are. Thus, the scan lines relatively close to the source driver 140 are electrically connected to the gate driver 150A. In addition, the scan lines relatively away from the source driver 140 are electrically connected to the gate driver 150B.

In this specification and the like, a determination of whether one scan line (a first scan line) is located closer to the source driver 140 than another scan line (a second scan line) is or whether the second scan line is located closer to the source driver 140 than the first scan line is may be made by, for example, comparing a distance between one point in the display driver IC 100 or the source driver 140 and one point in the first scan line with a distance between the one point in the display driver IC 100 or the source driver 140 and one point in the second scan line.

The signal lines YL[1] to YL[N] are arranged so as to each intersect the scan lines XL[1] to XL[M] at substantially right angles.

The pixel portion 160 includes pixels 162 arranged in M rows and N columns.

The pixel 162 is described here with reference to FIGS. 2A and 2B.

The pixel 162 includes a transistor, a capacitor, and a display element. The pixel 162 is electrically connected to one signal line and one scan line. FIGS. 2A and 2B each illustrate a configuration example of the pixel 162. Note that in each of FIGS. 2A and 2B, a pixel in a j-th row and a k-th column (j is a natural number less than or equal to M and k is a natural number less than or equal to N) is illustrated as a pixel in a given row and a given column.

The data voltage ($V_{DATA}$) that is output from the source driver 140 is input to the pixel 162 through the signal line. The scan voltage ($V_{SCAN}$) that is output from the gate driver 150A or the gate driver 150B is input to the pixel 162 through the scan line.

Examples of the display element that can be used in the pixel 162 include a liquid crystal element and a light-emitting element.

Details of the liquid crystal element and the light-emitting element that can be used in the pixel 162 will be described in a later embodiment.

FIG. 2A illustrates a pixel 162A as an example of using a liquid crystal element as the display element. The pixel 162A includes a transistor 191, a capacitor 192, and a liquid crystal element 193.

A gate of the transistor 191 is electrically connected to the scan line XL[j] at a node $N_{XL}[j][k]$. One of a source and a drain of the transistor 191 is electrically connected to the signal line YL[k] at a node $N_{YL}[j][k]$. The other of the source and the drain of the transistor 191 is electrically connected to the capacitor 192 and the liquid crystal element 193.

The transistor 191 serves as a switching element for controlling the connection between the liquid crystal element 193 and the signal line YL[k]. For example, when a pulse signal is input to the gate of the transistor 191 from the gate driver 150A or the gate driver 150B through the scan line XL[j], the transistor 191 is turned on, the signal line YL[k] and the liquid crystal element 193 are electrically connected to each other, and display data is written to the liquid crystal element 193.

FIG. 2B illustrates a pixel 162B as an example of a pixel configuration in which a light-emitting element is used as the display element. The pixel 162B includes a transistor 194, a transistor 195, and a light-emitting element 196. FIG. 2B illustrates a current supply line ZL[j] in addition to the scan line XL[j] and the signal line YL[k]. The current supply line ZL[j] is a wiring for supplying current to the light-emitting element 196.

A gate of the transistor 194 is electrically connected to the scan line XL[j] at the node $N_{XL}[j][k]$. One of a source and a drain of the transistor 194 is electrically connected to the signal line YL[k] at the node $N_{YL}[j][k]$. The other of the source and the drain of the transistor 194 is electrically connected to a gate of the transistor 195.

One of a source and a drain of the transistor 195 is electrically connected to the current supply line ZL[j]. The other of the source and the drain of the transistor 195 is electrically connected to the light-emitting element 196.

The transistor 194 serves as a switching element for controlling the connection between the gate of the transistor 195 and the signal line YL[k]. For example, when a pulse signal is input to the gate of the transistor 194 from the gate driver 150A or the gate driver 150B through the scan line XL[j], the transistor 194 is turned on, the signal line YL[k] and the gate of the transistor 195 are electrically connected to each other, and the data voltage ($V_{DATA}$) is input to the gate of the transistor 195. In addition, display data is written to the light-emitting element 196 by control of a current flowing to the light-emitting element 196 from the current supply line ZL[j] depending on the voltage applied to the gate of the transistor 195.

In this specification and the like, a pulse signal that is input to the pixel 162 from the gate driver 150A or the gate driver 150B in order to write display data to the display element may be referred to as a write signal or a scan voltage. Specifically, for example, a pulse signal that is input to the gate of the transistor 191 from the gate driver 150A or the gate driver 150B through the scan line XL[j] in order to write display data to the liquid crystal element 193 of the pixel 162A may be referred to as a write signal or a scan voltage. Furthermore, a pulse signal that is input to the gate of the transistor 194 from the gate driver 150A or the gate driver 150B through the scan line XL[j] in order to write display data to the light-emitting element 196 of the pixel 162B may be referred to as a write signal or a scan voltage.

The above is the description of the pixel 162.

Note that in this specification and the like, the scan line XL[j] refers to a scan line connected to a plurality of pixels in the j-th row. The signal line YL[k] refers to a signal line connected to a plurality of pixels in the k-th column.

In this specification and the like, a determination of whether one pixel (a first pixel) is located closer to the source driver 140 than another pixel (a second pixel) is or whether the second pixel is located closer to the source driver 140 than the first pixel is may be made by, for example, the scan lines connected to the first pixel and the second pixel.

For example, in the case where the first pixel is connected to the j-th scan line and the second pixel is connected to the (j+l)-th scan line (l is a natural number less than or equal to (M−j)), it can be determined that the first pixel is located closer to the source driver 140 than the second pixel is.

In this specification and the like, a determination of whether one pixel (a first pixel) is located closer to the source driver 140 than another pixel (a second pixel) is or whether the second pixel is located closer to the source driver 140 than the first pixel is may be made by, for example, comparing a distance between one point in the display driver IC 100 or the source driver 140 and one point in the first pixel with a distance between the one point in the display driver IC 100 or the source driver 140 and one point in the second pixel.

The above is a configuration of the display device of one embodiment of the present invention.

The display device of one embodiment of the present invention changes the pulse width of the write signal depending on the location of the pixel 162 to which the write signal is to be input.

Specifically, the pulse width of the write signal that is output from the gate driver 150A to the pixel 162 through the scan lines XL[1] to XL[m] is decreased, and the pulse width of the write signal that is output from the gate driver 150B to the pixel 162 through the scan lines XL[m+1] to XL[M] is increased. Accordingly, the pulse width of the write signal that is input to the pixel 162 located close to the source driver 140 can be decreased, and the pulse width of the write signal that is input to the pixel 162 located away from the source driver 140 can be increased. This ensures that the data voltage is written to the pixel 162 even in the case where it takes time to increase the data voltage that is input to the pixel 162 located away from the source driver 140.

Thus, in one embodiment of the present invention, it can be ensured that the scan voltage is written to the pixel 162 regardless of its location even in the case where the increase or decrease rate of the data voltage varies depending on the location of the pixel 162. In other words, even in the case where the increase or decrease rate of the data voltage at a node on the scan line connected to the pixel 162 varies depending on the location of the node, it can be ensured that the data voltage is written to the pixel 162 regardless of the location of the node.

Next, a specific example of a method for driving the display device of one embodiment of the present invention is described with reference to FIG. 3.

FIG. 3 is a timing chart illustrating examples of the digital signal Sum, the clock signal, and signals that are input to the signal line YL[k], the scan line XL[1], the scan line XL[m+1], the scan line XL[2], the scan line XL[m+2], and the scan line XL[3].

The timing chart in FIG. 3 illustrates a period in which the digital signal Sum is a digital signal S[1], a period in which the digital signal $S_{DIG}$ is a digital signal S[m+1], a period in which the digital signal Sum is a digital signal S[2], a period in which the digital signal Sum is a digital signal S[m+2], a period in which the digital signal Sum is a digital signal S[3], and a period in which the digital signal Sum is a digital signal S[m+3].

In the display device of one embodiment of the present invention, the digital signal Sum includes digital signals S[1] to SM. The digital signals S[1] to SM each contain display data for display by pixels in a certain row. For example, a given digital signal S[j] contains data for display by pixels in the j-th row. Note that periods of the digital signals S[1] to SM have an equal length.

The digital signal Sum alternately contains display data for display by pixels electrically connected to the gate driver 150A and display data for display by pixels electrically connected to the gate driver 150B. That is, the digital signal $S_{DIG}$ alternately contains one of the digital signals S[1] to S[m] and one of the digital signals S[m+1] to SM.

Specifically, as illustrated in FIG. 3, the digital signal $S_{DIG}$ sequentially becomes the digital signal S[1], the digital signal S[m+1], the digital signal S[2], the digital signal S[m+2], the digital signal S[3], and the digital signal S[m+3].

As described above, in the display device of one embodiment of the present invention, the control signals for the source driver 140 and the gate drivers 150A and 150B, such as the clock signal SILK, the clock signal $G_{CLKA}$, and the clock signal $G_{CLKB}$, are each a rectangular wave with a duty cycle of not 50%.

FIG. 3 illustrates a timing chart of the clock signal $G_{CLKA}$ as one example of the clock signals supplied to the source driver 140 and the gate drivers 150A and 150B.

In FIG. 3, the potential of the clock signal $G_{CLKA}$ is low in periods $\Delta T_0$, $\Delta T_2$, and $\Delta T_4$, and high in periods $\Delta T_1$, $\Delta T_3$, and $\Delta T_5$.

In FIG. 3, the periods $\Delta T_0$, $\Delta T_2$, and $\Delta T_4$ have an equal length. In addition, the periods $\Delta T_1$, $\Delta T_3$, and $\Delta T_5$ have an equal length. Moreover, the periods $\Delta T_0$, $\Delta T_2$, and $\Delta T_4$ have a longer length than the periods $\Delta T_1$, $\Delta T_3$, and $\Delta T_5$. Thus, the duty cycle of the clock signal $G_{CLKA}$ is not 50%.

In FIG. 3, the period $\Delta T_0$ starts concurrently with the period in which the digital signal $S_{DIG}$ is the digital signal S[1]. The period $\Delta T_1$ starts during the period in which the digital signal $S_{DIG}$ is the digital signal S[m+1]. The period $\Delta T_2$ starts concurrently with the period in which the digital signal $S_{DIG}$ is the digital signal S[2]. The period $\Delta T_3$ starts during the period in which the digital signal $S_{DIG}$ is the digital signal S[m+2]. The period $\Delta T_4$ starts concurrently with the period in which the digital signal $S_{DIG}$ is the digital signal S[3]. The period $\Delta T_5$ starts during the period in which the digital signal $S_{DIG}$ is the digital signal S[m+3].

In the period $\Delta T_1$, data for display by the pixels in the first row is supplied to the signal line YL[k]. In addition, in the period $\Delta T_1$, a write signal with a pulse width $\Delta t_1$ ($\Delta t_1 \leq \Delta T_1$) is supplied to the scan line XL[1].

In the period $\Delta T_2$, data for display by the pixels in the (m+1)-th row is supplied to the signal line YL[k]. In addition, in the period $\Delta T_2$, a write signal with a pulse width $\Delta t_2$ ($\Delta t_2 \leq \Delta T_2$) is supplied to the scan line XL[m+1].

In the period $\Delta T_3$, data for display by the pixels in the second row is supplied to the signal line YL[k]. In addition, in the period $\Delta T_3$, a write signal with a pulse width $\Delta t_3$ ($\Delta t_3 \leq \Delta T_3$) is supplied to the scan line XL[2].

In the period $\Delta T_4$, data for display by the pixels in the (m+2)-th row is supplied to the signal line YL[k]. In addition, in the period $\Delta T_4$, a write signal with a pulse width $\Delta t_4$ ($\Delta t_4 \leq \Delta T_4$) is supplied to the scan line XL[m+2].

In the period $\Delta T_5$, data for display by the pixels in the third row is supplied to the signal line YL[k]. In addition, in the period $\Delta T_5$, a write signal with a pulse width $\Delta t_5$ ($\Delta t_5 \leq \Delta T_5$) is supplied to the scan line XL[3].

As described above, the periods $\Delta T_2$ and $\Delta T_4$ have a longer length than the periods $\Delta T_1$, $\Delta T_3$, and $\Delta T_5$. Thus, the pulse widths $\Delta t_2$ and $\Delta t_4$ can be larger than the pulse widths $\Delta t_1$, $\Delta t_3$, and $\Delta t_5$.

Accordingly, the pulse width of the write signal supplied through the scan lines (e.g., the scan line XL[1], the scan line XL[2], and the scan line XL[3]) that are connected to the gate driver 150A can be decreased, and the pulse width of the write signal supplied through the scan lines (e.g., the scan line XL[m+1] and the scan line XL[m+2]) that are connected to the gate driver 150B can be increased. Therefore, the pulse width of the write signal that is input to the pixels located close to the source driver 140 can be decreased, and the pulse width of the write signal that is input to the pixels located away from the source driver 140 can be increased.

The above is the description of specific examples of methods for driving the display device of one embodiment of the present invention.

By using the above-described driving method, the display device of one embodiment of the present invention can change the pulse width of the write signal for each gate driver. Thus, it can be ensured that the scan voltage is written to the pixel 162 regardless of its location even in the case where the increase or decrease rate of the data voltage varies depending on the location of the pixel 162.

Accordingly, it can be ensured that the data voltage is written to a pixel regardless of its location even in the case where the increase or decrease rate of the data voltage varies depending on the location of the pixel owing to an increase in size or resolution of the display device of one embodiment of the present invention. Therefore, according to one embodiment of the present invention, display evenness of a large or high-resolution display device can be improved.

The display device of one embodiment of the present invention can suppress a decrease of the overall operating frequency by changing the pulse width of the write signal depending on the location of each pixel. Therefore, according to one embodiment of the present invention, the display quality of a large or high-resolution display device can be improved.

Next, a configuration of the source driver 140 is described with reference to FIGS. 4A and 4B.

The source driver 140 illustrated in FIG. 4A includes a shift register 141 (shown as "SR" in the diagram), a data register 142 (shown as "DATA REGISTER" in the diagram), a latch circuit 143 (shown as "LATCH" in the diagram), a digital-to-analog converter circuit 144 (shown as "DAC" in the diagram), and a buffer circuit 145 (shown as "BUFFER" in the diagram).

The clock signal SILK and the start pulse $S_{SP}$ are signals for driving the shift register 141. The display data DATA is a signal retained in the data register 142. The latch signal $S_{LATCH}$ is a signal for driving the latch circuit 143. The voltage $V_{DAC}$ is a voltage for generating the data voltage ($V_{DATA}$), which is a gray level voltage, in the digital-to-analog converter circuit 144. The voltage $V_{S-BUF}$ is a voltage applied as power for an operational amplifier in the buffer circuit 145.

FIG. 4B is an example of a circuit diagram of the operational amplifier included in the buffer circuit 145.

An operational amplifier 146 included in the buffer circuit 145 illustrated in FIG. 4B is supplied with the voltage $V_{S-BUF}$ and outputs the data voltage $V_{DATA}$. An L-level voltage $V_{S-BUF}$ is the ground voltage GND, and an H-level voltage $V_{S-BUF}$ is the voltage $V_{S-BUF}$.

Next, a configuration of a gate driver 150 that can be used as the gate drivers 150A and 150B is described with reference to FIGS. 5A and 5B.

The gate driver 150 illustrated in FIG. 5A includes a shift register 151 (shown as "SR" in the diagram) and a buffer circuit 152 (shown as "BUFFER" in the diagram). A clock signal $G_{CLK}$ and a start pulse $G_{SP}$ are signals for driving the shift register 151. The voltage $V_{G-BUF}$ is a voltage applied as power for an operational amplifier in the buffer circuit 152.

FIG. 5B is an example of a circuit diagram of the operational amplifier included in the buffer circuit 152.

An operational amplifier 153 included in the buffer circuit 152 illustrated in FIG. 5B is supplied with the voltage $V_{G-BUF}$ and outputs the scan voltage $V_{SCAN}$. An L-level voltage $V_{G-BUF}$ is the ground voltage GND, and an H-level voltage $V_{G-BUF}$ is the voltage $V_{G-BUF}$.

Next, the voltage generator circuit 130 is described with reference to FIGS. 6A and 6B.

A voltage generator circuit 130A illustrated in FIG. 6A is a circuit that generates a voltage $V_{POG}$. The voltage generator circuit 130A can generate the voltage $V_{POG}$ on the basis of the voltage $V_{DD}$ and the voltage $V_{SS}$ supplied from the external power supply 171. Thus, the display driver IC 100 can operate on the basis of the single power supply voltage supplied from the outside.

The voltage generator circuit 130A in FIG. 6A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{DD}$ and the voltage $V_{SS}$, the voltage $V_{POG}$, which has been increased to a positive voltage with a positively quintupled value of the voltage $V_{DD}$ by application of the clock signal CLK, can be obtained. Note that a forward voltage of the diodes D1 to D5 is 0 V. A desired voltage $V_{POG}$ can be obtained by changing the number of stages of the charge pump.

A voltage generator circuit 130B illustrated in FIG. 6B is a circuit that generates a voltage $V_{NEG}$. The voltage generator circuit 130B can generate the voltage $V_{NEG}$ on the basis of the voltage $V_{DD}$ and the voltage $V_{SS}$ supplied from the external power supply 171. Thus, the display driver IC 100 can operate on the basis of the single power supply voltage supplied from the outside.

The voltage generator circuit 130B in FIG. 6B is a four-stage charge pump including the diodes D1 to D5, the capacitors C1 to C5, and the inverter INV. The clock signal CLK is supplied to the capacitors C1 to C5 directly or through the inverter INV. When the power supply voltage of the inverter INV is a voltage applied on the basis of the voltage $V_{DD}$ and the voltage $V_{SS}$, the voltage $V_{NEG}$, which has been decreased from the voltage $V_{SS}$ to a negative voltage with a negatively quadrupled value of the voltage $V_{DD}$ by application of the clock signal CLK, can be obtained. Note that the forward voltage of the diodes D1 to D5 is 0 V. A desired voltage $V_{NEG}$ can be obtained by changing the number of stages of the charge pump.

At least part of this embodiment can be implemented in combination with any of the other embodiments described in this specification and the like as appropriate.

Embodiment 2

In this embodiment, a configuration example and the details of a display panel that can be used in the display device described in the above embodiment will be described.

<Block Diagram>

FIG. 7A is a block diagram illustrating a configuration of a display panel 300. The display panel 300 includes the pixel portion 160, the gate driver 150A, the gate driver 150B, and the source driver 140.

The display panel 300 includes a plurality of scan lines XL which are arranged substantially parallel to each other and whose potentials are controlled by the gate drivers 150A and 150B, and a plurality of signal lines YL which are arranged substantially parallel to each other and whose potentials are controlled by the source driver 140. The pixel portion 160 includes a plurality of pixels 162 arranged in a matrix.

Each of the scan lines XL is electrically connected to the pixels 162 in the corresponding row among the pixels 162 in the pixel portion 160. Each of the signal lines YL is electrically connected to the pixels 162 in the corresponding column among the pixels 162.

Transistors included in the gate drivers 150A and 150B and the source driver 140 (hereinafter, collectively referred to as a driver circuit) can be formed at the same time as transistors included in the pixels 162.

Part of the driver circuit or the entire driver circuit may be formed over another substrate and the driver circuit may be electrically connected to the display panel 300. For example, part of the driver circuit or the entire driver circuit may be formed over a single crystal substrate to form an IC chip, and the IC chip may be electrically connected to the display panel 300. The number of IC chips is not limited to one, and a necessary number of IC chips for the pixels 162 are provided. For example, the IC chip can be mounted on the display panel 300 by a chip on glass (COG) method or a chip on film (COF) method.

FIG. 7B illustrates an example in which the pixel portion 160 in FIG. 7A is divided into four pixel portions 160a, 160b, 160c, and 160d and the source driver 140 in FIG. 7A is divided into two source drivers 140A and 140B arranged above and below a pixel array. The pixels 162 included in the pixel portions 160a and 160b are electrically connected to the source driver 140A through signal lines YLa. In addition, the pixels 162 included in the pixel portions 160a and 160b are electrically connected to the gate driver 150A through the scan lines XL. The pixels 162 included in the pixel portions 160c and 160d are electrically connected to the source driver 140B through signal lines YLb. In addition, the pixels 162 included in the pixel portions 160c and 160d are electrically connected to the gate driver 150B through the scan lines XL. Note that the number of pixel portions obtained by dividing the pixel portion 160 is not necessarily four, and may be any number.

The configuration illustrated in FIG. 7B can reduce the number of pixels 162 connected to one signal line. That is, the capacitance connected to one signal line can be small. Consequently, in the display panel 300, the time for writing image data to the signal line can be shortened. The configuration illustrated in FIG. 7B is particularly preferably used for a high-resolution display panel such as an 8K (7680× 4320 pixels) display panel. For example, with the use of a pixel array including 4K (3840×2160) pixels as each of the pixel portions 160a to 160d, the display panel 300 including 8K pixels can be obtained.

Figure 8A:
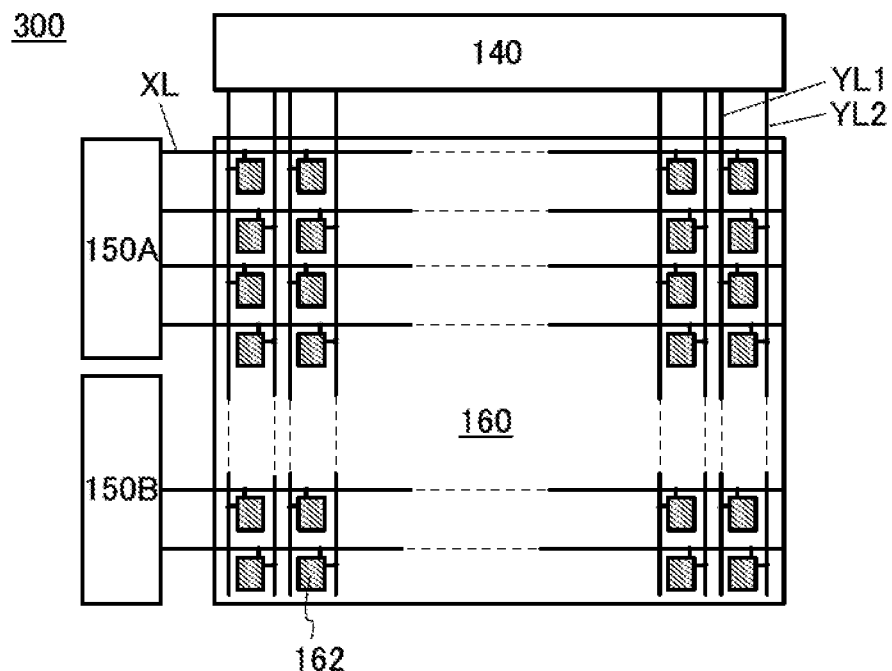
FIGS. 8A and 8B are block diagrams illustrating configuration examples of a display panel.

FIG. 8A illustrates an example in which the signal line YL in FIG. 7A is divided into two signal lines YL1 and YL2. The pixels 162 arranged in the same column are electrically connected to the signal lines YL1 and YL2 alternately.

The configuration illustrated in FIG. 8A can reduce the number of pixels 162 connected to one signal line. Consequently, in the display panel 300, the time for writing image data to the signal line can be shortened.

In the configuration in FIG. 7B, seams exist between the pixel arrays and are visible on a display image; however, the configuration in FIG. 8A does not have any seams and thus can prevent such a problem. Consequently, the display panel 300 can display a seamless and smooth image.

Note that the signal line YL is not necessarily divided into two signal lines. For example, in FIG. 8B, the signal line YL is divided into four signal lines YL1, YL2, YL3, and YL4.

Figure 8B:
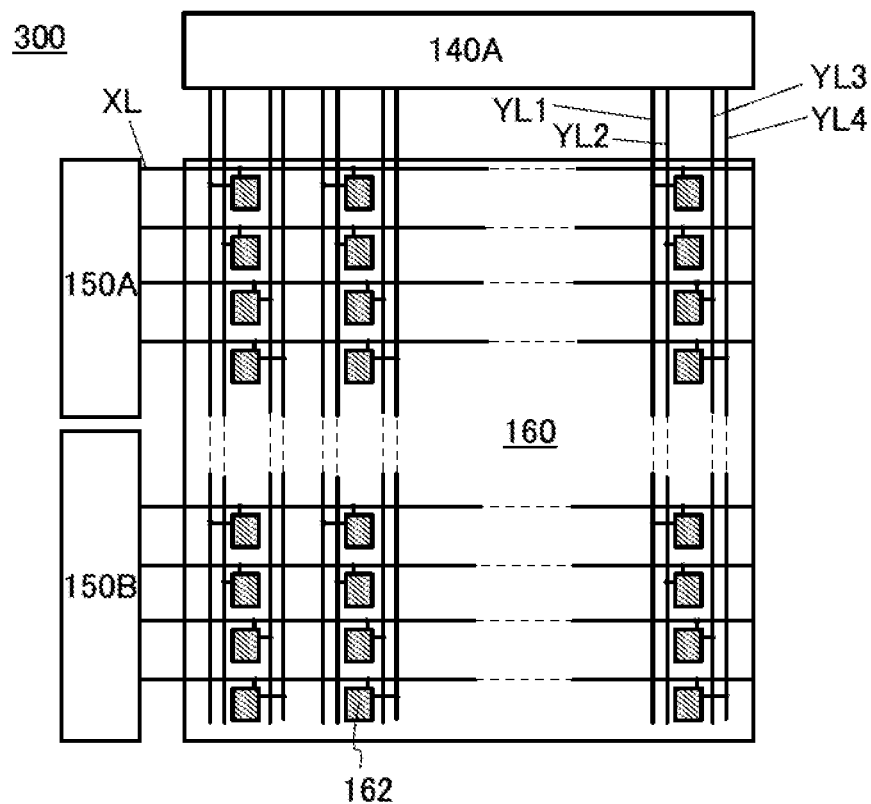

In the display panel 300 having the configuration illustrated in FIG. 8B, the number of pixels 162 connected to one signal line can be further reduced, resulting in a further reduction in the time for writing image data to the signal line. In addition, the display panel 300 can display a seamless and smooth image.

<Pixel Circuit>

Next, examples of a circuit configuration that can be used for the pixels 162 included in the display panels in FIGS. 7A and 7B and FIGS. 8A and 8B will be described with reference to FIGS. 9A and 9B.

Figure 9A:
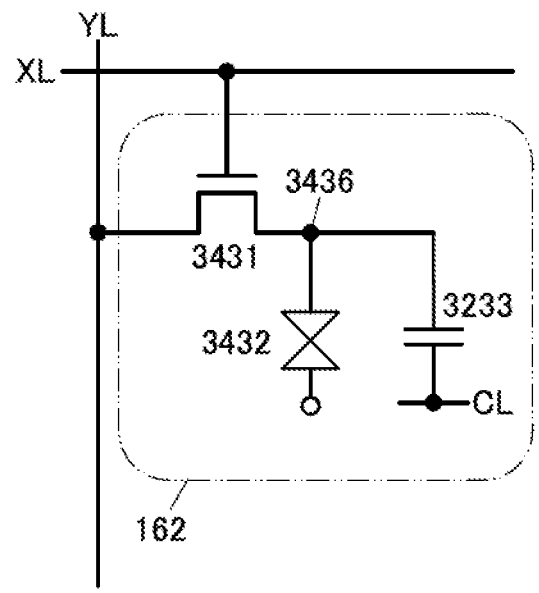
FIGS. 9A and 9B are circuit diagrams illustrating configuration examples of a pixel.

The pixel 162 illustrated in FIG. 9A includes a transistor 3431, a capacitor 3233, and a liquid crystal element 3432.

One of a source and a drain of the transistor 3431 is electrically connected to the signal line YL, and the other is electrically connected to a node 3436. A gate of the transistor 3431 is electrically connected to the scan line XL. The transistor 3431 has a function of controlling whether to write a data signal to the node 3436.

One of a pair of electrodes of the capacitor 3233 is electrically connected to a wiring to which a particular potential is supplied (hereinafter, also referred to as a "capacitor line CL"), and the other is electrically connected to the node 3436. The potential of the capacitor line CL is set in accordance with the specifications of the pixel 162 as appropriate. The capacitor 3233 has a function of storing data written to the node 3436.

One of a pair of electrodes of the liquid crystal element 3432 is supplied with a common potential, and the other is electrically connected to the node 3436. The alignment state of liquid crystals in the liquid crystal element 3432 depends on the potential applied to the node 3436.

The liquid crystal element 3432 can employ any of the following modes: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the mode include an electrically controlled birefringence (ECB) mode, a polymer dispersed liquid crystal (PDLC) mode, a polymer network liquid crystal (PNLC) mode, and a guest-host mode. Note that the present invention is not limited to these modes, and various modes can be used.

Figure 9B:
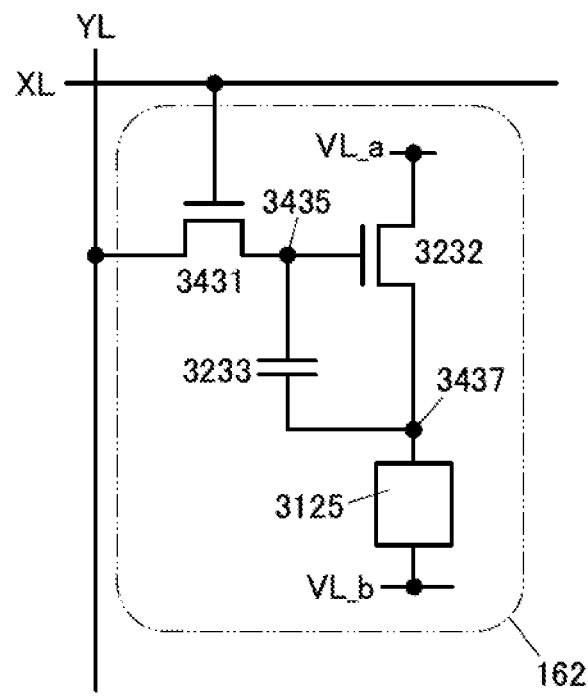

The pixel 162 illustrated in FIG. 9B includes the transistor 3431, the capacitor 3233, a transistor 3232, and a light-emitting element 3125.

One of the source and the drain of the transistor 3431 is electrically connected to the signal line YL to which the data signal is supplied, and the other is electrically connected to a node 3435. The gate of the transistor 3431 is electrically connected to the scan line XL to which a gate signal is supplied. The transistor 3431 has a function of controlling whether to write a data signal to the node 3435.

One of the pair of electrodes of the capacitor 3233 is electrically connected to the node 3435, and the other is electrically connected to a node 3437. The capacitor 3233 functions as a storage capacitor for storing data written to the node 3435.

One of a source and a drain of the transistor 3232 is electrically connected to a potential supply line VL_a, and the other is electrically connected to the node 3437. A gate of the transistor 3232 is electrically connected to the node 3435. The transistor 3232 has a function of controlling a current flowing through the light-emitting element 3125.

One of an anode and a cathode of the light-emitting element 3125 is electrically connected to a potential supply line VL_b, and the other is electrically connected to the node 3437.

As the light-emitting element 3125, an organic electroluminescent element (also referred to as an organic EL element) or the like can be used, for example. Note that the light-emitting element 3125 is not limited thereto and may be an inorganic EL element containing an inorganic material, for example.

For example, the potential supply line VL_a has a function of supplying a high-potential voltage. The potential supply line VL_b has a function of supplying a low-potential voltage.

<Cross-Sectional View>

Next, the structure examples of the display panel 300 will be described with reference to cross-sectional views in FIGS. 10A and 10B and FIGS. 11A and 11B.

The display panel 300 in FIGS. 10A and 10B includes an electrode 4015, and the electrode 4015 is electrically connected to a terminal included in an FPC 4018 through an anisotropic conductive layer 4019. The electrode 4015 is electrically connected to a wiring 4014 in an opening formed in insulating layers 4112, 4111, and 4110. The electrode 4015 is formed of the same conductive layer as a first electrode layer 4030.

The pixel 162 provided over a first substrate 4001 includes a transistor; for example, FIG. 10A illustrates the transistor 3431 included in the pixel 162 and FIG. 10B illustrates the transistor 3232 included in the pixel 162.

The transistors 3431 and 3232 are provided over an insulating layer 4102. The transistors 3431 and 3232 include electrodes 517 over the insulating layer 4102. An insulating layer 4103 is formed over the electrodes 517. Semiconductor layers 512 are formed over the insulating layer 4103. Electrodes 510 and electrodes 511 are formed over the semiconductor layers 512. The insulating layer 4110 and the insulating layer 4111 are formed over the electrodes 510 and the electrodes 511. Electrodes 516 are formed over the insulating layer 4110 and the insulating layer 4111. The electrodes 510 and the electrodes 511 are formed of the same conductive layer as the wiring 4014.

In each of the transistors 3431 and 3232, the electrode 517 functions as a gate, the electrode 510 functions as one of a source and a drain, the electrode 511 functions as the other of the source and the drain, and the electrode 516 functions as a back gate.

Since the transistors 3431 and 3232 each have a bottom gate structure and include a back gate, the on-state current of the transistors can be increased. Moreover, the threshold voltage of the transistors can be controlled. Note that the electrode 516 may be omitted in some cases to simplify the manufacturing process.

In each of the transistors 3431 and 3232, the semiconductor layer 512 functions as a channel formation region. For the semiconductor layer 512, crystalline silicon, polycrystalline silicon, amorphous silicon, metal oxide, an organic semiconductor, or the like may be used. Impurities may be introduced to the semiconductor layer 512, if necessary, to increase the conductivity of the semiconductor layer 512 or control the threshold voltage of the transistor.

In the case where metal oxide is used for the semiconductor layer 512, the semiconductor layer 512 preferably contains indium (In). When metal oxide containing indium is used for the semiconductor layer 512, the carrier mobility (electron mobility) of the semiconductor layer 512 can be high. The semiconductor layer 512 is preferably an oxide semiconductor containing an element M. The element M is preferably aluminum (Al), gallium (Ga), tin (Sn), or the like. Other elements that can be used as the element M are boron (B), silicon (Si), titanium (Ti), iron (Fe), nickel (Ni), germanium (Ge), yttrium (Y), zirconium (Zr), molybdenum (Mo), lanthanum (La), cerium (Ce), neodymium (Nd), hafnium (Hf), tantalum (Ta), tungsten (W), and the like. Note that two or more of the above elements may be used in combination as the element M. The element M is an element having high bonding energy with oxygen, for example. The element M is an element whose bonding energy with oxygen is higher than that of indium, for example. The semiconductor layer 512 is preferably metal oxide containing zinc (Zn). The metal oxide containing zinc is easily crystallized in some cases.

The semiconductor layer 512 is not limited to the metal oxide containing indium. The semiconductor layer 512 may be, for example, metal oxide that does not contain indium and contains at least one of zinc, gallium, and tin (e.g., zinc tin oxide or gallium tin oxide).

The display panel 300 in FIGS. 10A and 10B includes the capacitor 3233. The capacitor 3233 has a region in which the electrode 511 overlaps with an electrode 4021 with the insulating layer 4103 positioned therebetween. The electrode 4021 is formed of the same conductive layer as the electrodes 517.

An example of a liquid crystal display panel including a liquid crystal element as a display element is illustrated in FIG. 10A. In FIG. 10A, the liquid crystal element 3432 which is a display element includes the first electrode layer 4030, a second electrode layer 4031, and a liquid crystal layer 4008. Insulating layers 4032 and 4033 serving as alignment films are provided so that the liquid crystal layer 4008 is positioned therebetween. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided in order to control a distance between the first electrode layer 4030 and the second electrode layer 4031 (a cell gap). Alternatively, a spherical spacer may be used.

In the case where a liquid crystal element is used as the display element, thermotropic liquid crystal, low-molecular liquid crystal, high-molecular liquid crystal, polymer dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

The specific resistivity of the liquid crystal material is higher than or equal to $1 \times 10^9$ Ω·cm, preferably higher than or equal to $1 \times 10^{11}$ Ω·cm, and further preferably higher than or equal to $1 \times 10^{12}$ Ω·cm. Note that the specific resistivity in this specification is measured at 20° C.

In the case where the transistor 3431 is an OS transistor, the transistor 3431 can have a small current in an off state (off-state current). Accordingly, an electrical signal such as an image signal can be held for a longer period, and a writing interval can be set longer in an on state. Thus, the frequency of refresh operation can be reduced, which leads to an effect of reducing power consumption.

In the display panel, a black matrix (a light-blocking layer), an optical member (an optical substrate) such as a polarizing member, a retardation member, or an anti-reflection member, and the like may be provided as appropriate. For example, circular polarization may be employed by using a polarizing substrate and a retardation substrate. In addition, a backlight, a side light, or the like may be used as a light source.

FIG. 10B illustrates an example of a display panel including, as a display element, a light-emitting element such as an EL element. EL elements are classified into organic EL elements and inorganic EL elements.

In an organic EL element, by voltage application, electrons are injected from one electrode to an EL layer and holes are injected from the other electrode to the EL layer. The carriers (electrons and holes) are recombined, and thus, a light-emitting organic compound is excited. The light-emitting organic compound returns to a ground state from the excited state, thereby emitting light. Owing to such a mechanism, this light-emitting element is referred to as a current-excitation light-emitting element. In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like. The EL layer can be formed by an evaporation method (including a vacuum evaporation method), a transfer method, a printing method, an inkjet method, a coating method, or the like. Note that a quantum dot (Q-Dot) may be used instead of the light-emitting organic compound. With the use of the quantum dot, an emission spectrum can be narrowed, resulting in light emission with high color purity.

Inorganic EL elements are classified into a dispersion-type inorganic EL element and a thin-film inorganic EL element according to their element structures. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localization type light emission that utilizes inner-shell electron transition of metal ions.

FIG. 10B illustrates an example in which an organic EL element is used as the light-emitting element 3125.

In FIG. 10B, the light-emitting element 3125 is electrically connected to the transistor 3232 provided in the pixel 162. The structure of the light-emitting element 3125 is the stacked-layer structure including the first electrode layer 4030, a light-emitting layer 4511, and the second electrode layer 4031; however, this embodiment is not limited to this structure. The structure of the light-emitting element 3125 can be changed as appropriate depending on the direction in which light is extracted from the light-emitting element 3125, or the like.

A partition wall 4510 is formed using an organic insulating material or an inorganic insulating material. It is particularly preferable that the partition wall 4510 be formed using a photosensitive resin material to have an opening over the first electrode layer 4030 so that a side surface of the opening slopes with continuous curvature.

The light-emitting layer 4511 may be formed using a single layer or a plurality of layers stacked.

A protective layer may be formed over the second electrode layer 4031 and the partition wall 4510 in order to prevent entry of oxygen, hydrogen, moisture, carbon dioxide, or the like into the light-emitting element 3125. For the protective layer, silicon nitride, silicon nitride oxide, aluminum oxide, aluminum nitride, aluminum oxynitride, aluminum nitride oxide, diamond like carbon (DLC), or the like can be used. In addition, in a space which is enclosed by the first substrate 4001, the second substrate 4006, and a sealant 4005, a filler 4514 is provided for sealing. It is preferable that the light-emitting element be packaged (sealed) with a protective film (such as a laminate film or an ultraviolet curable resin film) or a cover member with high air-tightness and little degasification so that the light-emitting element is not exposed to the outside air, in this manner.

As the filler 4514, an ultraviolet curable resin or a thermosetting resin can be used as well as an inert gas such as nitrogen or argon; for example, polyvinyl chloride (PVC), an acrylic resin, polyimide, an epoxy resin, a silicone resin, polyvinyl butyral (PVB), or ethylene vinyl acetate (EVA) can be used. A drying agent may be contained in the filler 4514.

A glass material such as a glass frit, or a resin that is curable at room temperature such as a two-component-mixture-type resin, a light curable resin, a thermosetting resin, and the like can be used for the sealant 4005. A drying agent may be contained in the sealant 4005.

In addition, if needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 can also be formed using one or more kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and nitrides thereof.

Alternatively, a conductive composition containing a conductive high molecule (also referred to as conductive polymer) can be used for the first electrode layer 4030 and the second electrode layer 4031. As the conductive high molecule, a 7c-electron conjugated conductive high molecule can be used. For example, polyaniline or a derivative thereof, polypyrrole or a derivative thereof, polythiophene or a derivative thereof, a copolymer of two or more of aniline, pyrrole, and thiophene or a derivative thereof can be used.

In order to extract light emitted from the light-emitting element 3125 to the outside, at least one of the first electrode layer 4030 and the second electrode layer 4031 is transparent. In accordance with how to extract light, the structures of the display panels are classified into a top emission structure, a bottom emission structure, and a dual emission structure. In the top emission structure, light is extracted through the substrate 4006. In the bottom emission structure, light is extracted through the substrate 4001. In the dual emission structure, light is extracted through both the substrate 4006 and the substrate 4001. For example, the second electrode layer 4031 is transparent in the case of the top emission structure. The first electrode layer 4030 is transparent in the case of the bottom emission structure. The first and second electrode layers 4030 and 4031 are transparent in the case of the dual emission structure.

Figure 11A:
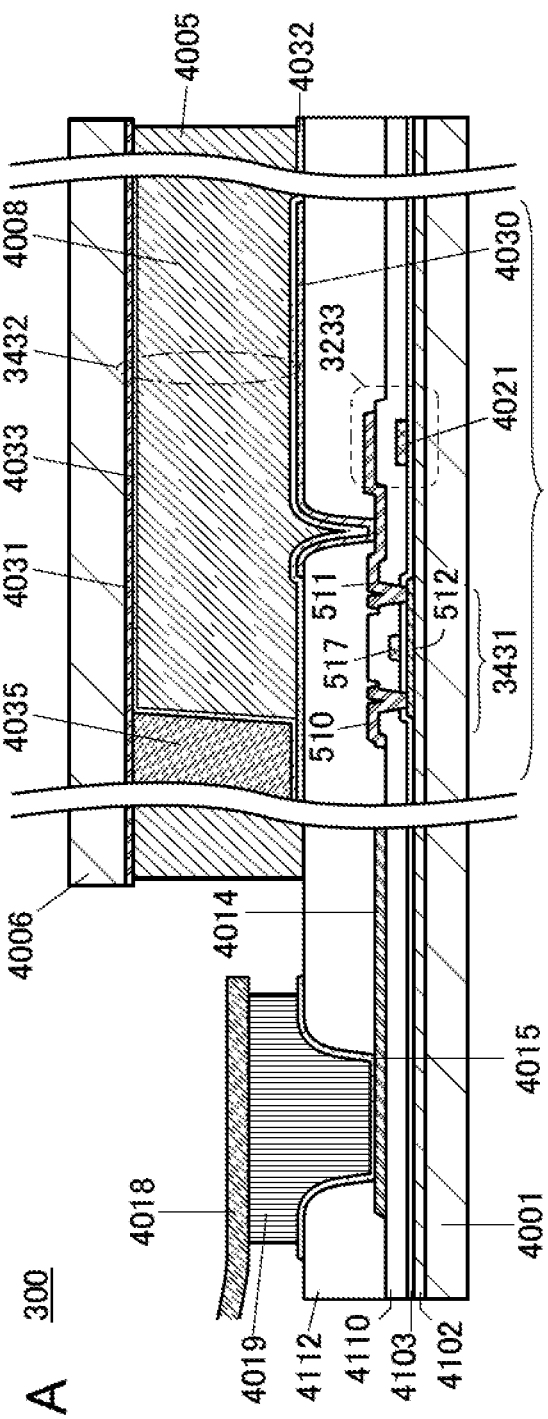
FIGS. 11A and 11B are cross-sectional views illustrating structure examples of a display panel.

FIG. 11A is a cross-sectional view in which a top-gate transistor is provided as the transistor 3431 in FIG. 10A. Similarly, FIG. 11B is a cross-sectional view in which a top-gate transistor is provided as the transistor 3232 in FIG. 10B.

Figure 11B:
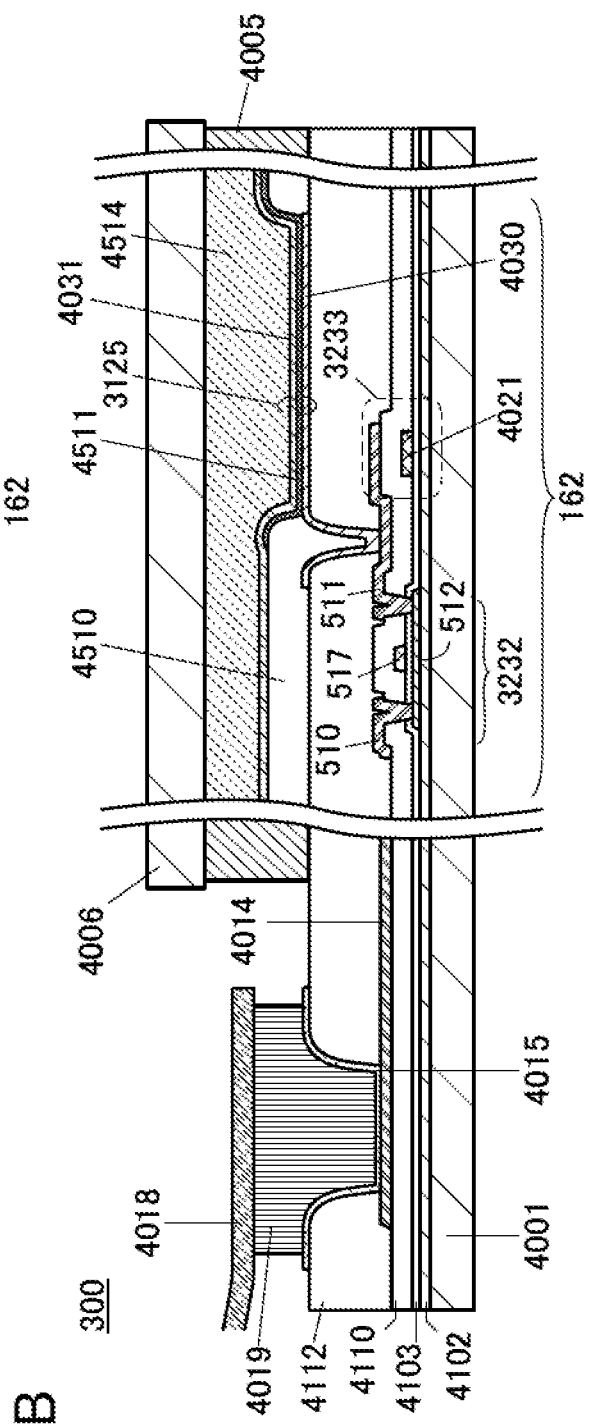

In each of the transistors 3431 and 3232 in FIGS. 11A and 11B, the electrode 517 functions as a gate, the electrode 510 functions as one of a source and a drain, and the electrode 511 functions as the other of the source and the drain.

For the details of other components in FIGS. 11A and 11B, refer to the description of FIGS. 10A and 10B.

At least part of this embodiment can be implemented in combination with any of the other embodiments described in this specification and the like as appropriate.

Embodiment 3

In this embodiment, another structure example of a display panel that can be used in the display device of one embodiment of the present invention will be described. In addition, in this embodiment, application examples of the display device described in any of the foregoing embodiments to a display module and application examples of the display device to an electronic device will be described with reference to FIGS. 12A and 12B, FIG. 13, and FIGS. 14A to 14E.

<Examples of Mounting IC on Display Panel>

Figure 12A:
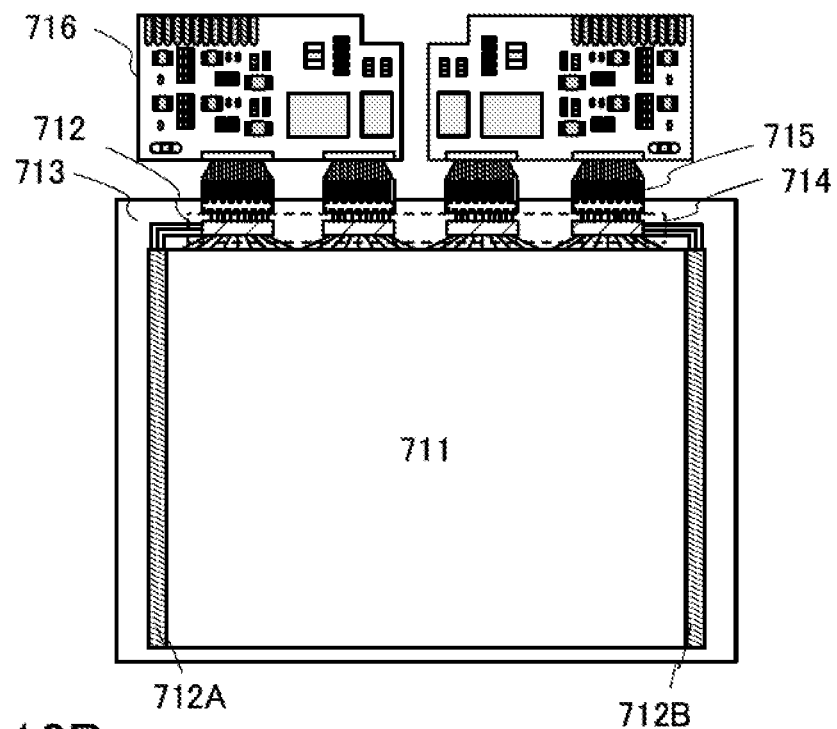
FIGS. 12A and 12B each illustrate an example of a display panel.
Figure 12B:
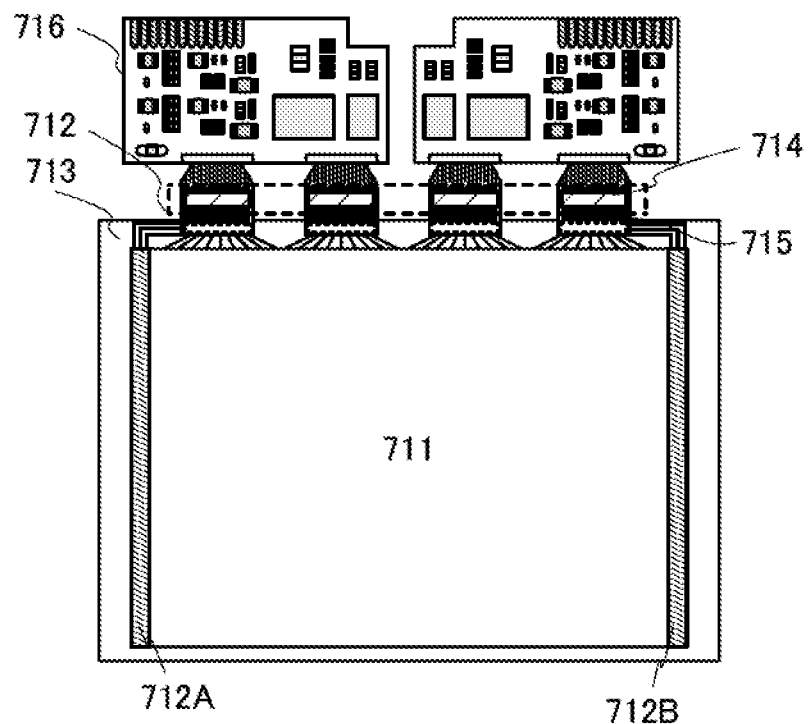

FIGS. 12A and 12B each illustrate a structure example of the display panel that can be used in the display device of one embodiment of the present invention.

In FIG. 12A, a source driver 712 and gate drivers 712A and 712B are provided around a display portion 711 of the display panel, and a display driver IC 714 is mounted on a substrate 713 as the source driver 712.

The display driver IC 714 is mounted on the substrate 713 using an anisotropic conductive adhesive and an anisotropic conductive film.

The display driver IC 714 is connected to an external circuit board 716 via an FPC 715.

In the example of FIG. 12B, the source driver 712 and the gate drivers 712A and 712B are provided around the display portion 711, and the display driver IC 714 is mounted on the FPC 715 as the source driver 712.

Mounting the display driver IC 714 on the FPC 715 allows a larger display portion 711 to be provided over the substrate 713, resulting in a narrower frame.

<Application Example of Display Module>

Next, an application example of a display module using the display panel illustrated in FIG. 7A or FIG. 7B or the display panel illustrated in FIG. 12A or FIG. 12B will be described with reference to FIG. 13.

FIG. 13 is a cross-sectional schematic view of a display module 6000 with an optical touch sensor.

The display module 6000 includes a light-emitting portion 6015 and a light-receiving portion 6016 provided on a printed circuit board 6010. A pair of light guide portions (a light guide portion 6017a and a light guide portion 6017b) is provided in a region surrounded by an upper cover 6001 and a lower cover 6002.

For example, a plastic or the like can be used for the upper cover 6001 and the lower cover 6002. The upper cover 6001 and the lower cover 6002 can each be thin (e.g., more than or equal to 0.5 mm and less than or equal to 5 mm). In that case, the display module 6000 can be significantly lightweight. In addition, the upper cover 6001 and the lower cover 6002 can be manufactured with a small amount of material, and therefore, manufacturing cost can be reduced.

A display panel 6006 overlaps with the printed circuit board 6010 and a battery 6011 with a frame 6009 located therebetween. The display panel 6006 and the frame 6009 are fixed to the light guide portion 6017a and the light guide portion 6017b.

Light 6018 emitted from the light-emitting portion 6015 travels over the display panel 6006 through the light guide portion 6017a and reaches the light-receiving portion 6016 through the light guide portion 6017b. For example, blocking of the light 6018 by a sensing target such as a finger or a stylus can be sensed as touch operation.

A plurality of light-emitting portions 6015 are provided along two adjacent sides of the display panel 6006, for example. A plurality of light-receiving portions 6016 are provided so as to face the light-emitting portions 6015. Accordingly, information about the position of touch operation can be obtained.

As the light-emitting portion 6015, a light source such as an LED element can be used. It is particularly preferable to use a light source that emits infrared light, which is not visually recognized by users and is harmless to users, as the light-emitting portion 6015.

As the light-receiving portion 6016, a photoelectric element that receives light emitted from the light-emitting portion 6015 and converts it into an electrical signal can be used. A photodiode that can receive infrared light can be suitably used.

For the light guide portions 6017a and 6017b, members that transmit at least the light 6018 can be used. With the use of the light guide portions 6017a and 6017b, the light-emitting portion 6015 and the light-receiving portion 6016 can be placed under the display panel 6006, and a malfunction of the touch sensor due to external light reaching the light-receiving portion 6016 can be suppressed. It is particularly preferable to use a resin which absorbs visible light and transmits infrared light. This is more effective in suppressing the malfunction of the touch sensor.

<Application Examples of Display Device to Electronic Device>

Next, an electronic device using the above display module for a display panel will be described. Examples of the electronic device include a computer, a portable information terminal (including a mobile phone, a portable game machine, and an audio reproducing device), electronic paper, a television device (also referred to as television or television receiver), and a digital video camera.

Figure 14A:
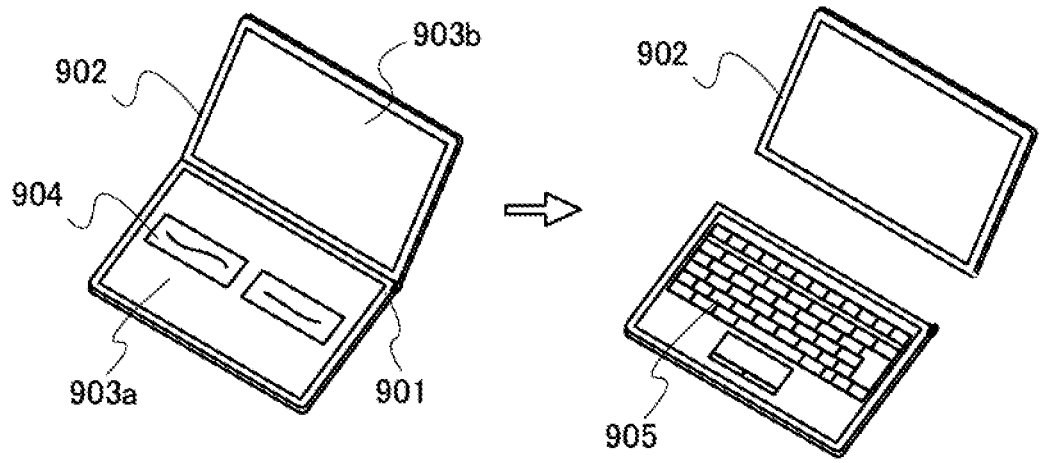
FIGS. 14A to 14E illustrate examples of electronic devices.

FIG. 14A illustrates a portable information terminal that includes a housing 901, a housing 902, a first display portion 903a, a second display portion 903b, and the like. At least one of the housings 901 and 902 includes the display module including the display device of the foregoing embodiment. Thus, it is possible to obtain a portable information terminal with a smaller circuit area.

Note that the first display portion 903a is a panel having a touch input function, and for example, as illustrated in the left of FIG. 14A, whether "touch input" is performed or whether "keyboard input" is performed can be selected with a selection button 904 displayed on the first display portion 903a. Since selection buttons with a variety of sizes can be displayed, the portable information terminal can be easily used by people of any generation. For example, when "keyboard input" is selected, a keyboard 905 is displayed on the first display portion 903a as illustrated in the right of FIG. 14A. Thus, for example, letters can be input quickly by key input as in the case of using a conventional information terminal.

One of the first and second display portions 903a and 903b can be detached from the portable information terminal as illustrated in the right of FIG. 14A. Providing the second display portion 903b with a touch input function makes the portable information terminal convenient to carry because the weight can be further reduced and the portable information terminal can be operated with one hand while the other hand supports the housing 902.

The portable information terminal in FIG. 14A can have a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (an earphone terminal, a USB terminal, or the like), a recording medium insertion portion, and the like may be provided on the back surface or the side surface of the housing.

The portable information terminal illustrated in FIG. 14A may be capable of transmitting and receiving data wirelessly. Through wireless communication, desired book data or the like can be purchased and downloaded from an e-book server. It is preferable that an image be displayed in the second display portion 903b by the display method described in Embodiment 1, in which case display quality can be improved.

In addition, the housing 902 illustrated in FIG. 14A may be equipped with an antenna, a microphone function, and/or a wireless communication function to be used as a mobile phone.

Figure 14B:
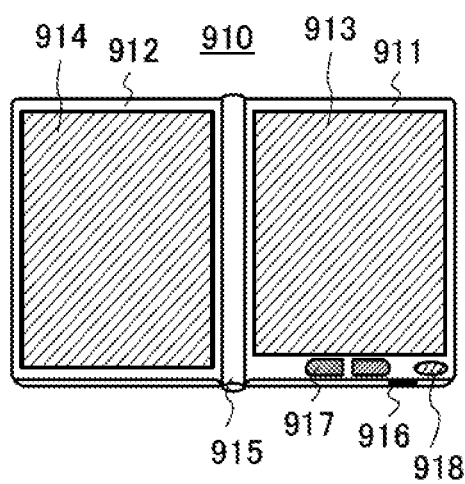

FIG. 14B illustrates an e-book reader 910 including electronic paper. The e-book reader has two housings of a housing 911 and a housing 912. The housing 911 and the housing 912 are provided with a display portion 913 and a display portion 914, respectively. The housings 911 and 912 are connected by a hinge 915 and can be opened or closed with the hinge 915 as an axis. The housing 911 is provided with a power switch 916, an operation key 917, a speaker 918, and the like. It is preferable that an image be displayed in the display portion 914 by the display method described in Embodiment 1, in which case display quality can be improved.

Figure 14C:
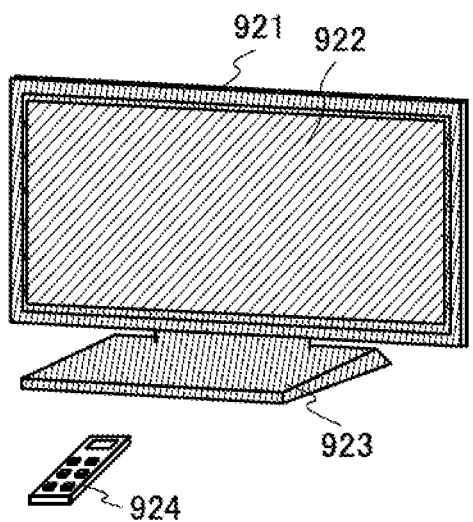

FIG. 14C illustrates a television device including a housing 921, a display portion 922, a stand 923, and the like. The television device can be operated with a switch of the housing 921 and/or a remote controller 924. It is preferable that an image be displayed in the display portion 922 by the display method described in Embodiment 1, in which case display quality can be improved.

Figure 14D:
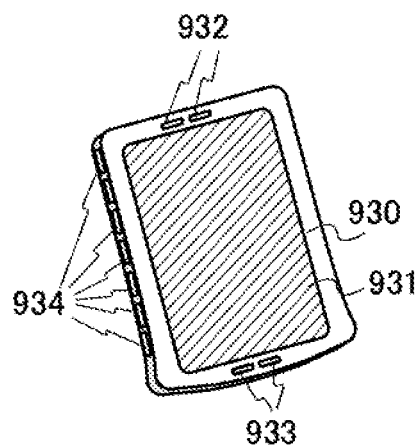

FIG. 14D illustrates a smartphone in which a main body 930 is provided with a display portion 931, a speaker 932, a microphone 933, operation buttons 934, and the like. It is preferable that an image be displayed in the display portion 931 by the display method described in Embodiment 1, in which case display quality can be improved.

Figure 14E:
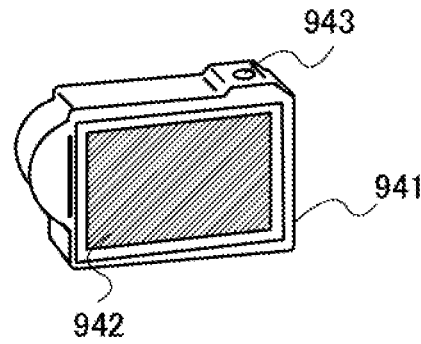

FIG. 14E illustrates a digital camera including a main body 941, a display portion 942, an operation switch 943, and the like. It is preferable that an image be displayed in the display portion 942 by the display method described in Embodiment 1, in which case display quality can be improved.

At least part of this embodiment can be implemented in combination with any of the other embodiments described in this specification and the like as appropriate.

This application is based on Japanese Patent Application Serial No. 2017-004943 filed with Japan Patent Office on Jan. 16, 2017, the entire contents of which are hereby incorporated by reference.

What is claimed is:

1. A display device comprising:
   a source driver;
   a first gate driver;
   a second gate driver;
   a first pixel;
   a second pixel; and
   a third pixel,
   wherein the source driver is electrically connected to a source line,
   wherein the first pixel is electrically connected to the source line and the first gate driver,
   wherein the second pixel is electrically connected to the source line and the second gate driver,
   wherein the third pixel is electrically connected to the source line and the first gate driver,
   wherein the first pixel is directly adjacent to the third pixel,
   wherein the first gate driver is configured to supply a first write signal to the first pixel,
   wherein the second gate driver is configured to supply a second write signal to the second pixel after the first gate driver supplies the first write signal,
   wherein the first gate driver is configured to supply a third write signal to the third pixel after the second gate driver supplies the second write signal,
   wherein a pulse width of the second write signal is larger than a pulse width of the first write signal, and
   wherein a second period while the second write signal is supplied does not overlap with a first period while the first write signal is supplied or a third period while the third write signal is supplied.

2. The display device according to claim 1, further comprising:
   a fourth pixel,
   wherein the fourth pixel is electrically connected to the source line and the second gate driver,
   wherein the second pixel is directly adjacent to the fourth pixel,
   wherein the second gate driver is configured to supply a fourth write signal to the fourth pixel after the first gate driver supplies the third write signal, and
   wherein a pulse width of the fourth write signal is larger than the pulse width of the first write signal and a pulse width of the third write signal.

3. The display device according to claim 1, wherein the source driver is closer to the first pixel than the second pixel.

4. The display device according to claim 2,
    wherein the source driver is closer to the third pixel than the second pixel, and
    wherein the source driver is farther away from the fourth pixel than the first pixel and the third pixel.

5. The display device according to claim 1, further comprising a display controller,
    wherein the display controller is configured to supply a control signal for the source driver, a control signal for the first gate driver, and a control signal for the second gate driver,
    wherein the source driver is configured to receive the control signal for the source driver,
    wherein the first gate driver is configured to receive the control signal for the first gate driver,
    wherein the second gate driver is configured to receive the control signal for the second gate driver, and
    wherein one of the control signal for the first gate driver and the control signal for the second gate driver is a rectangular wave with a duty cycle of not 50%.

6. A display device comprising:
    a source driver;
    a first gate driver;
    a second gate driver;
    a first pixel group; and
    a second pixel group,
    wherein the source driver is electrically connected to a source line,
    wherein pixels in the first pixel group are adjacent each other,
    wherein pixels in the second pixel group are adjacent each other,
    wherein the first pixel group is electrically connected to the source line and the first gate driver,
    wherein the second pixel group is electrically connected to the source line and the second gate driver,
    wherein the first gate driver is configured to supply a first write signal to each of the pixels in the first pixel group,
    wherein the second gate driver is configured to supply a second write signal to each of the pixels in the second pixel group,
    wherein a pulse width of the second write signal is larger than a pulse width of the first write signal,
    wherein supply of the first write signal by the first gate driver and supply of the second write signal by the second gate driver are performed alternately, and
    wherein a second period while the second write signal is supplied does not overlap with a first period while the first write signal is supplied.

7. The display device according to claim 6, wherein the source driver is closer to the first pixel group than the second pixel group.

8. The display device according to claim 6, further comprising a display controller,
    wherein the display controller is configured to supply a control signal for the source driver, a control signal for the first gate driver, and a control signal for the second gate driver,
    wherein the source driver is configured to receive the control signal for the source driver,
    wherein the first gate driver is configured to receive the control signal for the first gate driver,
    wherein the second gate driver is configured to receive the control signal for the second gate driver, and
    wherein one of the control signal for the first gate driver and the control signal for the second gate driver is a rectangular wave with a duty cycle of not 50%.

* * * * *